United States Patent
Shima

(10) Patent No.: US 8,049,251 B2
(45) Date of Patent: Nov. 1, 2011

(54) SEMICONDUCTOR DEVICE AND METHOD FOR MANUFACTURING THE SAME

(75) Inventor: Masashi Shima, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 11/520,766

(22) Filed: Sep. 14, 2006

(65) Prior Publication Data

US 2007/0063222 A1    Mar. 22, 2007

Related U.S. Application Data

(63) Continuation of application No. PCT/JP2004/005309, filed on Apr. 14, 2004.

(51) Int. Cl.
    *H01L 31/00* (2006.01)
(52) U.S. Cl. .............. 257/192; 257/288; 257/E29.021; 438/576; 438/197
(58) Field of Classification Search .......... 257/192, 257/288, E29.021; 438/576, 197, 300, 369, 438/94, 191
    See application file for complete search history.

(56) References Cited

U.S. PATENT DOCUMENTS

| | | |
|---|---|---|
| 6,271,551 B1 | 8/2001 | Schmitz et al. |
| 6,744,104 B1 | 6/2004 | Aoki et al. |
| 6,984,844 B2 | 1/2006 | Takagi |
| 7,226,843 B2 * | 6/2007 | Weber et al. .......... 438/305 |
| 2002/0097608 A1 | 7/2002 | Skotnicki et al. |
| 2003/0122203 A1 * | 7/2003 | Nishinohara et al. ..... 257/402 |
| 2004/0094811 A1 | 5/2004 | Takagi et al. |
| 2004/0212013 A1 * | 10/2004 | Takagi et al. .......... 257/347 |
| 2006/0081925 A1 * | 4/2006 | Wang et al. .......... 257/344 |

FOREIGN PATENT DOCUMENTS

| | | |
|---|---|---|
| JP | 11-500873 A | 1/1999 |
| JP | 2000-150669 A | 5/2000 |
| JP | 2002-314089 A | 10/2002 |

(Continued)

OTHER PUBLICATIONS

Notification of Transmittal of Translation of the International Preliminary Report on Patentability (Form PCT/IB/338) of International Application No. PCT/JP2004/005309 mailed Oct. 26, 2006 with Forms PCT/IB/373 and PCT/ISA/237.

(Continued)

*Primary Examiner* — Cuong Q Nguyen
*Assistant Examiner* — Cathy N Lam
(74) *Attorney, Agent, or Firm* — Westerman, Hattori, Daniels & Adrian, LLP

(57) ABSTRACT

In a semiconductor film having a heterojunction structure, for example a semiconductor film (11) including a SiGe layer (2) and a Si layer (3) formed on the SiGe layer (2), impurity concentration is controlled in such a manner that the concentration of impurity in the lower, SiGe layer (2) becomes higher than that in the upper, Si layer (3) by exploiting the fact that there is a difference between the SiGe layer (2) and the Si layer (3) in the diffusion coefficient of the impurity. The impurity contained in the semiconductor film 11 is of the conductivity type opposite to that of the transistor (p-type in the case of an n-type MOS transistor whereas n-type in the case of a p-type MOS transistor). In this way, the mobility in a semiconductor device including a semiconductor film having a heterojunction structure with a compression strain structure is increased, thereby improving the transistor characteristics and reliability of the device.

7 Claims, 13 Drawing Sheets

FOREIGN PATENT DOCUMENTS

WO 03/063254 A1 7/2003

OTHER PUBLICATIONS

Kern (Ken) Rim et al., "Fabrication and Analysis of Deep Submicron Strained-Si N-MOSFET's", IEEE Transactions of Electron Devices, vol. 47, No. 7, Jul. 2000, pp. 1406-1415.

T. Kawashima et al., "Proposal of N-channel Heterostructure Dynamic Threshold-Voltage MOSFET (HDTMOS) with P-type Doped SiGe Body", Device Research Conference, 2002, $60^{th}$ DRC. Conference Digest, Jun. 2002, pp. 51-52.

T. Ernst et al., "Fabrication of a novel strained SiGe:C-channel planar 55nm nMOSFET for High- Performance CMOS", 2002 Symposium on VLSI Technology Digest of Technical Papers, pp. 92-93.

International Search Report PCT/JP2004/005309 date of mailing Jul. 20, 2004.

Japanese Office Action dated Dec. 14, 2010, issued in corresponding Japanese Patent Application No. 2006-512221.

* cited by examiner

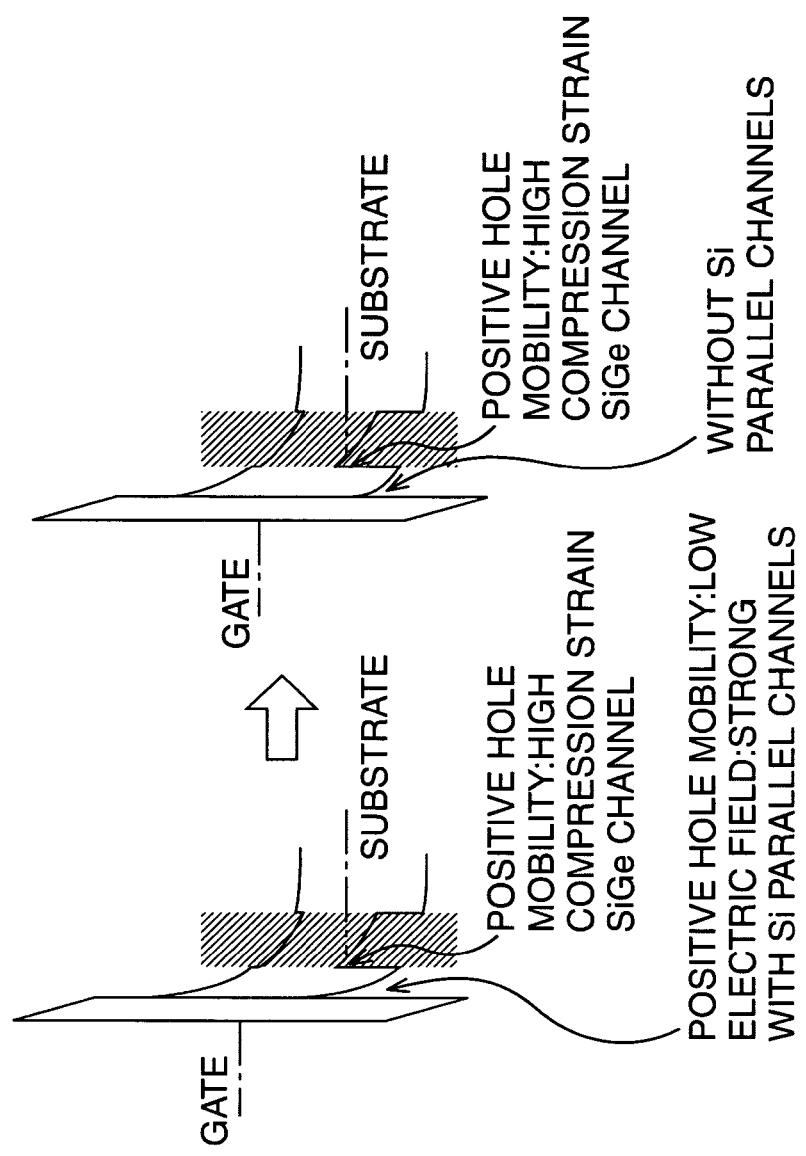
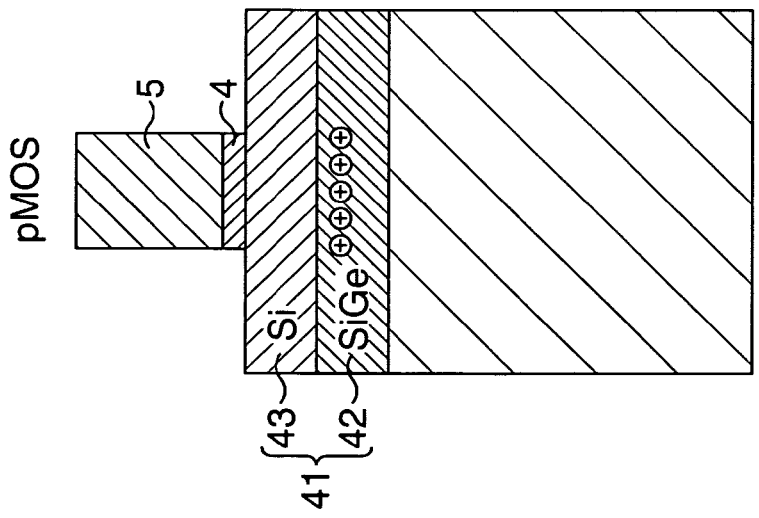

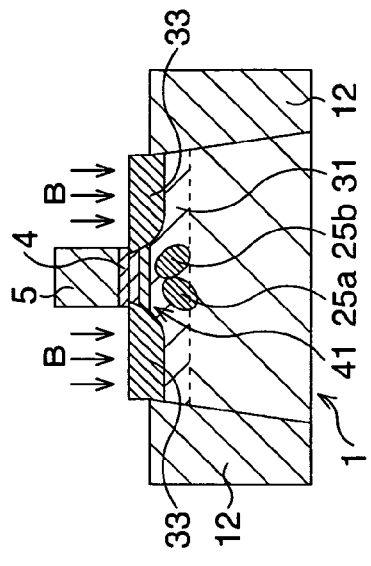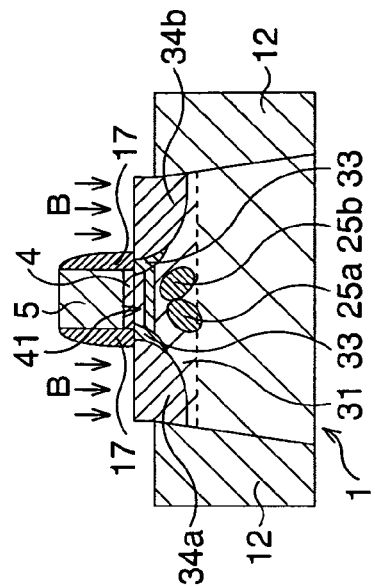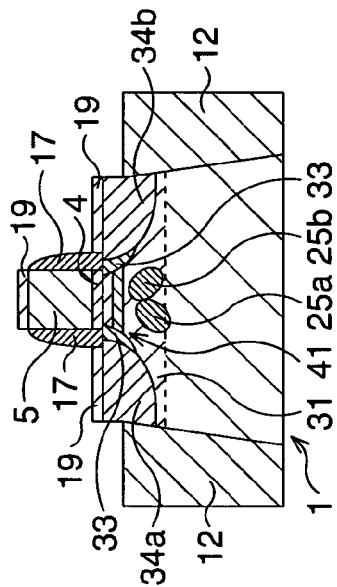
FIG. 8A  FIG. 8D
FIG. 8B  FIG. 8E
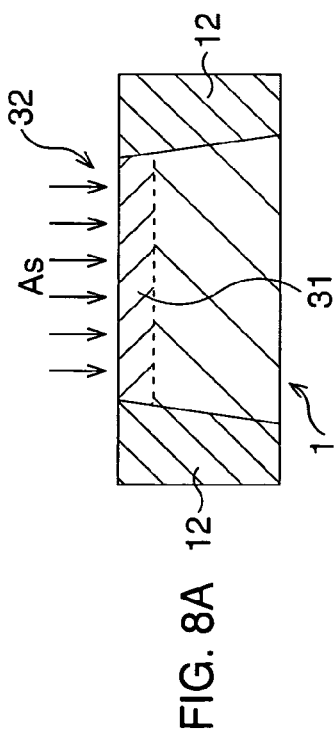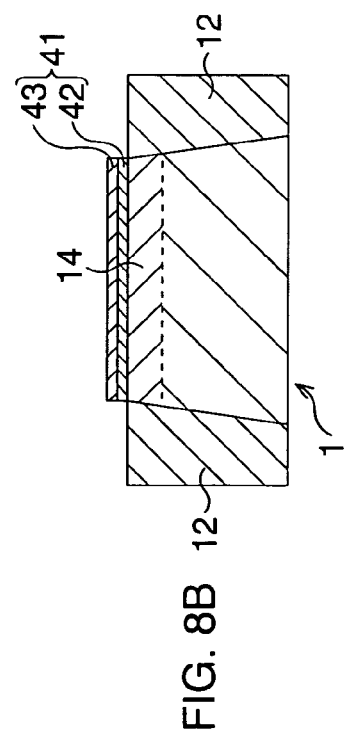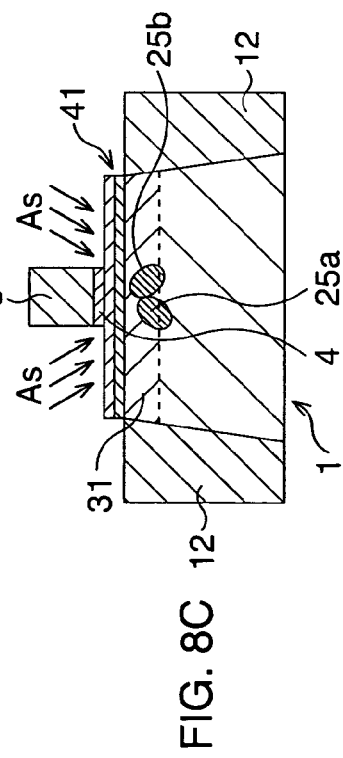
FIG. 8C  FIG. 8F

SEMICONDUCTOR DEVICE AND METHOD FOR MANUFACTURING THE SAME

TECHNICAL FIELD

The present invention relates to an MIS transistor in which a channel is formed in a semiconductor film having a heterojunction structure consisting of stacked layers of two different types of semiconductors having different diffusion coefficients, and to a method for manufacturing the same, which are especially suitable for use in n-type and p-type MOS transistors having a CMOS structure.

BACKGROUND ART

MOS transistors have been developed in the past that have a semiconductor film with a heterojunction structure in which physical properties of the semiconductor material forming a channel conducting electricity are changed by applying strain to its crystal to improve the mobility in the channel. As shown in FIG. 12 (which is of n-type. Reference numerals of elements of a p-type MOS transistor are enclosed in parentheses.), formed on an Si substrate 101 of such a MOS transistor is a semiconductor film 111 (121) consisting of a SiGe layer 102 (112), which has a compression strain structure, and a Si layer 103 (113), which is a cap film for forming a gate insulating film, stacked in this order. A gate electrode 105 is patterned on a gate insulating film 104 on the semiconductor film 111 (121), and an extension region 106 (116) and source/drain 107 (117) are formed by doping portions of the semiconductor film 111 (121) on both sides of the gate electrode 105 with an impurity. In the MOS transistor, the mobility of positive holes is high because of the compression strain structure of the SiGe layer 102 (112) that is formed on the Si substrate 101 in such a manner that its lattice matches to the Si substrate 101. Thus, especially the characteristics of p-type MIS transistor can be significantly improved.

Japanese Patent Application Laid-Open No. 2002-314089

However, MIS transistors having a semiconductor film with a compressed strain structure have problems described below (FIG. 13). For convenience, the source/drain region 107 (117) shown in FIG. 12 is omitted from FIGS. 13A and 13B.

As shown in FIG. 13A, n-type MOS transistors have problems that:
(1) the mobility of electrons decreases; and
(2) off-current ($I_{off}$) increases because an n-type impurity (for example arsenic (As)) diffuses fast from the extension region 106 into the SiGe layer 102 and the threshold voltage ($V_{th}$) shifts significantly in a short channel. Therefore, characteristics of the n-type MIS transistor degrade significantly.

As shown in FIG. 13B, p-type MOS transistor also has problems that:
(1) the mobility of positive holes decreases because of an electric field increasing because an n-type impurity (for example arsenic (As)) fast diffuses in the SiGe layer 112 and therefore the concentration of the n-type impurity in the Si layer 113 increases and the electric field in the Si layer 113 increases; and
(2) the effective mobility decreases because a channel is formed in the Si layer 113 in parallel with a channel in the SiGe layer 112.

In this way, the n-type and p-type MOS transistors having a compression strain structure have their inherent problems, which make it prohibitively difficult to integrate them to give a CMOS transistor having good characteristics.

The present invention has been made in light of these problems and an object of the present invention is to provide a semiconductor device including a semiconductor film having a heterojunction structure with a compression strain structure and a method for manufacturing the same that implements a high reliability by increasing the mobility in the semiconductor device and improving its transistor characteristics.

SUMMARY OF THE INVENTION

The inventor has devised the following inventive modes as a result of a keen examination.

A semiconductor device according to the present invention includes: a semiconductor substrate; a semiconductor film formed on the semiconductor substrate; a gate formed on an insulator film on the semiconductor film; and a pair of first impurity diffusion regions formed by doping the semiconductor film on both side of the gate with a first impurity; wherein the semiconductor film has a heterojunction structure formed by two layers of semiconductors of different types stacked in which a second impurity exhibits different diffusion coefficients, and the second impurity is distributed with a higher concentration in one of the semiconductor film than in the other of the semiconductor films.

A semiconductor manufacturing method according to the present invention includes the steps of: forming a semiconductor film on a substrate; patterning a gate on an insulator film on the semiconductor film; and forming a pair of first impurity diffusion regions by doping the semiconductor film on both sides of the gate with a first impurity; wherein the semiconductor film is formed to have a heterojunction structure consisting of stacked layers of semiconductors of different types in which a second impurity exhibits different diffusion coefficients and the concentration of the second impurity is controlled in such a manner that the second impurity is distributed with a higher concentration in one of the semiconductor film than that in the other of the semiconductor films.

BRIEF DESCRIPTION OF THE DRAWINGS

FIG. 2A is a schematic cross-sectional diagram showing main components of a p-type MOS transistor according to the present invention;

FIG. 2B is a schematic diagram showing an energy band structure in which a bias is applied to the gate electrode of the p-type MOS transistor according to the present invention;

FIGS. 8A to 8F are schematic cross-sectional diagrams showing stepwise a method for manufacturing an n-type MOS transistor according to a sixth embodiment;

DETAILED DESCRIPTION OF THE PREFERRED EMBODIMENTS

-Key Features of the Present Invention-

According to the present invention, the impurity concentrations in a semiconductor film having a heterojunction structure consisting of a stack of a SiGe layer and a Si layer, for example, are controlled so that the impurity concentration in the underlying SiGe layer exceeds the impurity concentration in the Si layer, by using the fact that the SiGe and Si layers have different diffusion coefficients. Here, the impurity contained in the semiconductor film has the conductivity type opposite to that of the transistor (a p-type impurity for an n-type MOS transistor whereas an n-type impurity for a p-type MOS transistor).

Figure 1B:
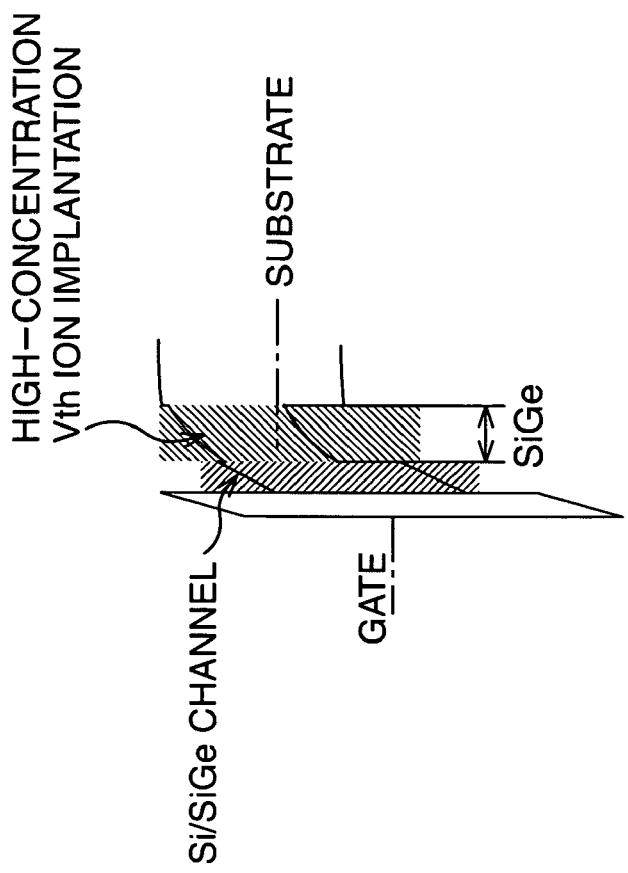
FIG. 1B is a schematic diagram showing an energy band structure in which a bias is applied to the gate electrode of the n-type MOS transistor according to the present invention.

Key features of the present invention will be described with respect to n-type and p-type MOS transistors with reference to FIG. 1 (n-type) and FIG. 2 (p-type). For convenience, only a semiconductor film 11, 41 consisting of a SiGe layer 2, 42 and a Si layer 3, 43 formed on a silicon semiconductor substrate (Si substrate) 1 and a gate electrode 5 patterned on a gate insulating film 4 on the semiconductor film 11, 41 are shown in FIGS. 1A and 2A as components of the MOS transistors. FIGS. 1B and 2B show energy band structures in which a bias is applied to a gate electrode.

Figure 1A:
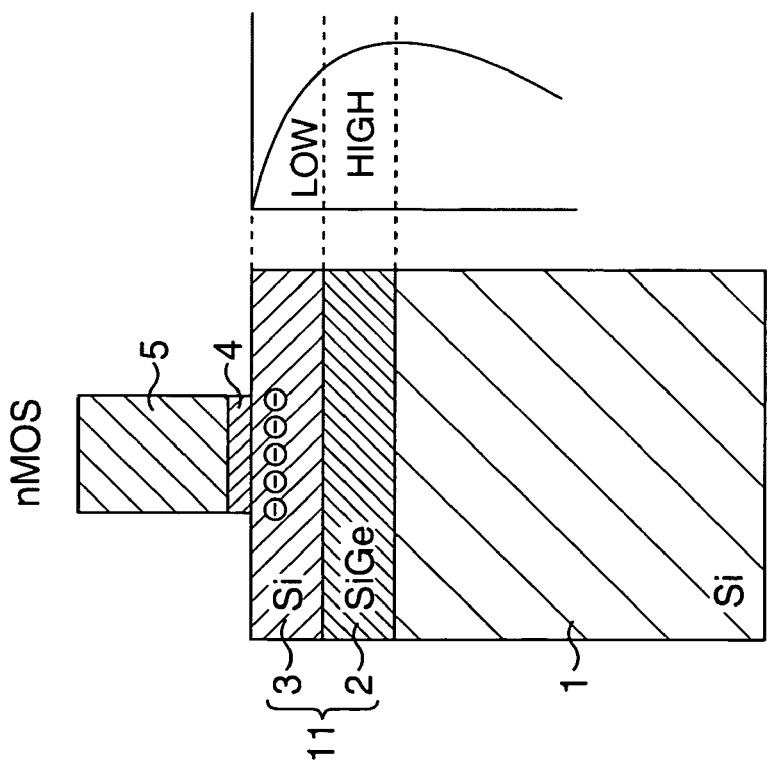
FIG. 1A is a schematic cross-sectional diagram showing main components of an n-type MOS transistor according to the present invention.

In an n-type MOS transistor according to the present invention, impurity concentrations are controlled so that the concentration of the p-type impurity, for example, boron B, in the SiGe layer 2 exceeds that in the Si layer 3 as shown in the right-hand part of FIG. 1A, in particular, so that a concentration distribution in the SiGe layer 2 and Si layer 3 as shown in the right-hand part of FIG. 1A results, in order to localize electrons into the Si layer 3, rather than the SiGe layer 2. As a result, the electric field in the Si layer 3 is reduced as shown in FIG. 1B and therefore the Si layer 3 functions as an electron channel with a high mobility. Furthermore, the higher-impurity-concentration control for the p-type impurity in the SiGe layer 2 also inhibits adverse effects of n-purity diffusion from an extension region on the SiGe layer 2.

In a p-type MOS transistor according to the present invention, in order to prevent the SiGe layer 42 and the Si layer 43 from forming parallel channels, impurity concentrations are controlled so that the concentration of the n-type impurity, for example arsenic (As), in the SiGe layer 42 exceeds that in the Si layer 43, to localize positive holes into the SiGe layer 42 as shown in FIG. 2A. As a result, the electric field in the Si layer 43 is reduced as shown in FIG. 2B and only the SiGe layer 42 functions as a positive hole channel with a high mobility.

In a MOS transistor having a compression strain structure, there is little potential difference between the gate electrode and drain whereas there is a potential difference between the gate electrode and source. Accordingly, the above-described problems with the MOS transistor are remarkable on the source side of the semiconductor film. Therefore, in the present invention, in order to reduce the electric field in the Si layer 3, 43 on the source side of the semiconductor film 11, 41 in both n-type and p-type MOS transistors (especially in the p-type MOS transistor), impurity concentrations must be controlled in such a manner that the concentration of the impurity (p-type impurity in the n-type MOS transistor whereas n-type in the p-type MOS transistor) in the Si layer 3, 43 does not exceed that in the SiGe layer 2, 42 at least on the source side, preferably in such a manner that the impurity concentration in the SiGe layer 2, 42 exceeds that in the Si layer 3, 43.

Specific Embodiments to which the Present Invention is Applied

Specific embodiments of the present invention will be described in detail below with reference to the accompanying drawings.

First Embodiment

In a first embodiment, p-type impurity ion implantation into a Si substrate for threshold voltage control is used as a control method for achieving a concentration distribution as shown in the right-hand part of FIG. 1A in a semiconductor film (SiGe layer and Si layer) that forms a channel in an n-type MOS transistor. The diffusion coefficient of a p-type impurity, for example boron B, is higher in the SiGe layer and lower in the Si layer. The difference in diffusion coefficient is used to thermally diffuse boron into the semiconductor film. The difference in diffusion coefficient results in a higher concentration of boron in the SiGe layer than that in the Si layer.

FIGS. 3A to 3F are schematic cross-sectional diagram showing stepwise a method for manufacturing an n-type MOS transistor according to the first embodiment. In the first embodiment, a structure of the n-type MOS transistor will be described along with the manufacturing method.

Figure 3A:
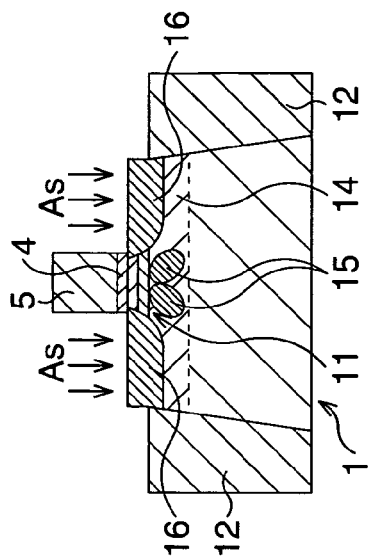
FIGS. 3A to 3F are schematic cross-sectional diagrams showing stepwise a method for manufacturing an n-type MOS transistor according to a first embodiment.

First, a device isolation structure, which herein is an STI (Shallow Trench Isolation) structure 12 in which a trench formed in a device isolation region of a silicon semiconductor substrate (Si substrate) 1 is filled with an insulator such as a silicon oxide film, is formed in the device isolation region to define an active region 13 as shown in FIG. 3A. Then, for the purpose of controlling the threshold voltage ($V_{th}$), a dose of $1 \times 10^{13}/cm^2$ of ions of a p-type impurity, which is boron herein, is implanted with an acceleration energy of 10 keV to form a channel impurity region 14 on the surface of the active region 13.

Figure 3B:
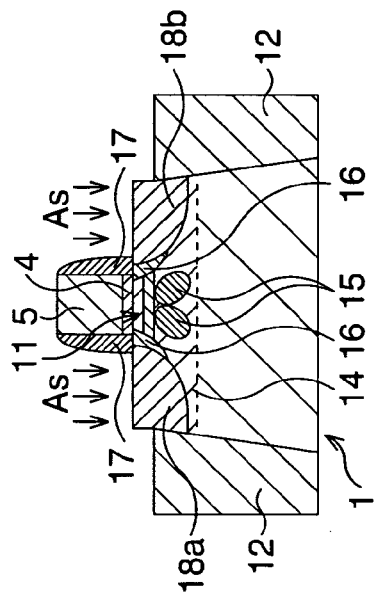

Then, a CVD method is used to selectively deposit a thin SiGe layer 2 and Si layer 3 on the active region 13 to form a two-layered semiconductor film 11 as shown in FIG. 3B. Here, in order to ensure that the above-described impurity distribution of boron in the semiconductor film 11 will be achieved by using activation annealing of a channel impurity region 14 in a later step, the SiGe layers 2 are formed thicker than the Si layer 3. For example the SiGe layer 2 is formed to a thickness of approximately 4 nm whereas the Si layer 3 is formed to a thickness of approximately 3 nm.

Figure 3C:
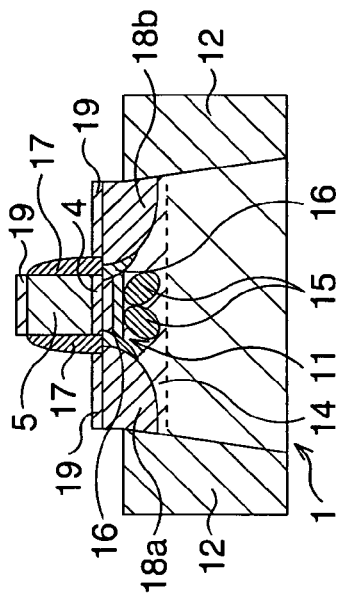

Then, a silicon oxide film, which forms a gate insulating film 4, is formed on the Si layer 3 to a thickness of approximately 1.5 nm as shown in FIG. 3C. A polycrystalline silicon film is then deposited on the gate insulating film 4 and is patterned to form a gate electrode 5. In order to adjust the impurity profile around the channel to suppress a short-channel effect, a dose of $1\times10^{13}/cm^2$ of ions of a p-type impurity, boron herein, is implanted into the surface of the semiconductor film 11 and the Si substrate 1 with an acceleration energy of 10 keV at a tilt angle of 45 degrees (with respect to the normal to the substrate plane) by using the gate electrode 5 as a mask to form a pair of pocket regions 15.

Figure 3D:
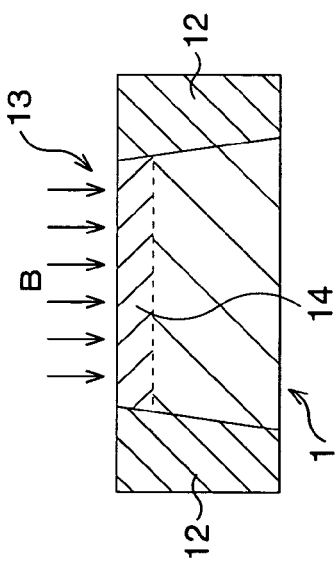

Then, the gate electrode 5 is used as a mask to implant a dose of $1\times10^{14}/cm^2$ of ions of an n-type impurity, arsenic (As) herein, into the surface of the semiconductor film 11 and the Si substrate 1 with an acceleration energy of 5 keV at a tilt angle of 0 degrees to form a pair of extension regions 16 as shown in FIG. 3D.

Figure 3E:
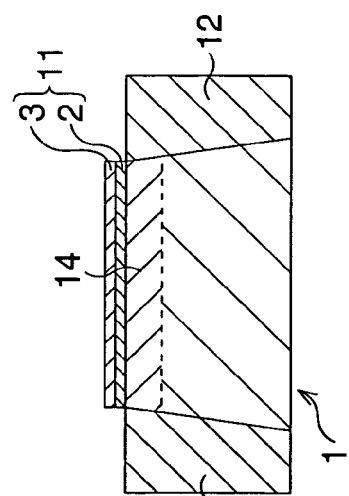

Then, an insulator film, a silicon oxide film herein, is deposited on the entire surface to cover the gate electrode 5 and anisotropic etching (etching back) is performed on the entire surface of the silicon oxide film so that the silicon oxide film is left only on both side-surfaces of the gate electrode 5, thus forming sidewall insulator films 17 as shown in FIG. 3E. Then, the gate electrode 5 and the sidewall insulator films 17 are used as a mask to implant a dose of $1\times10^{15}/cm^2$ of ions of an n-type impurity, arsenic (As) herein, into the surface of the semiconductor film 11 and the Si substrate 1 with an acceleration energy of 30 keV at a tilt angle of 0 degrees to form a source region 18a and a drain region 18b that overlap a portion of the extension regions 16 and are deeper than the extension regions 16.

Then, activation annealing is performed at a temperature of 1,000° C. for one second to thermally diffuse the implanted ions of impurities. During the activation annealing, the implanted ions of boron to form the channel impurity region 14 exhibit a higher diffusion coefficient in the SiGe layer 2 and a lower diffusion coefficient in the Si layer 3. Accordingly, a large amount of boron diffuses from the channel impurity region 14 to the SiGe layer 2 whereas a small amount of boron diffuses from the SiGe layer 2 to the Si layer 3. As a result, the boron is distributed in the SiGe layer 2 with a higher concentration and distributed in the Si layer 3 with a lower concentration than that in the SiGe layer 2. Accordingly, the electric field in the Si layer 3 is reduced and therefore the Si layer 3 functions as an electron channel with a high mobility. Furthermore, higher-boron-concentration control in the SiGe layer 2 also inhibits an adverse effect (short-channel effect: an increase in off-current due to a shift of $V_{th}$) of diffusion of arsenic from the extension regions 16 on the SiGi layer 2.

Figure 3F:
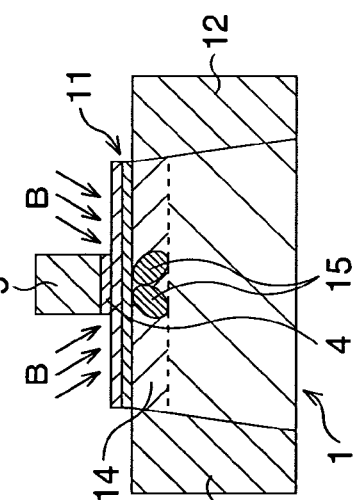

Then, a metal silicide, a Ni film herein, is formed on the entire surface and thermal treatment is applied to form a silicide (NiSi) film 19 on the gate electrode 5 and on the Si layer 3 in the source/drain regions 18a, 18b (salicidation) as shown in FIG. 3F. Then, an unreacted Ni film is removed, and inter-layer insulator films, contact holes, and a wiring layer are formed to complete the n-type MOS transistor.

As has been described, according to the first embodiment, the p-type impurity ion implantation for controlling $V_{th}$ in an n-type MOS transistor including a semiconductor film having a heterojunction structure with a compression strain structure can be used to make the concentration of the p-type impurity in the SiGe layer 2 higher than that in the Si layer 3 while controlling the threshold voltage. As a result, only the Si layer 3 functions as a channel, thereby increasing the mobility of electrons. Thus, a highly reliable n-type MOS transistor with improved transistor characteristics can be implemented easily and reliably.

Second Embodiment

In a second embodiment, ion implantation of a p-type impurity into an Si substrate for threshold voltage control and ion implantation of the p-type impurity for suppressing a short-channel effect are used as a control method for achieving a concentration distribution as shown in the right-hand part of FIG. 1A in a semiconductor film (the SiGe layer and Si layer) that forms a channel in an n-type MOS transistor. A p-type impurity, for example boron B, exhibits a higher diffusion coefficient in the SiGe layer and a lower diffusion coefficient in the Si layer. The difference in diffusion coefficient is used to thermally diffuse boron into the semiconductor film. Because of the difference in diffusion coefficient, the concentration of the boron in the SiGe layer becomes higher than that in the Si layer.

FIGS. 4A to 4F are schematic cross-sectional diagrams showing stepwise a method for manufacturing an n-type MOS transistor according to the second embodiment. In the second embodiment, a structure of the n-type MOS transistor will be described along with the manufacturing method.

Figure 4A:
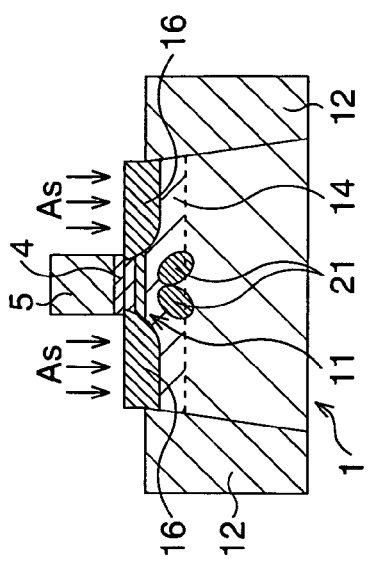
FIGS. 4A to 4F are schematic cross-sectional diagrams showing stepwise a method for manufacturing an n-type MOS transistor according to a second embodiment.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 13 as shown in FIG. 4A. Then, for the purpose of controlling the threshold voltage ($V_{th}$), a dose of $1\times10^{13}/cm^2$ of ions of a p-type impurity, which is boron herein, is implanted with an acceleration energy of 10 keV into the surface of the active region 13 to form a channel impurity region 14.

Figure 4B:
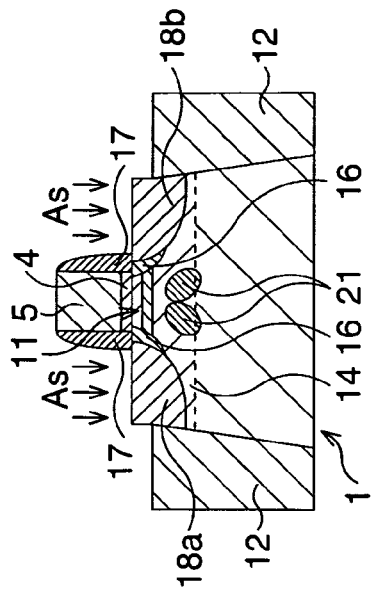

Then, a CVD method is used to selectively deposit a thin SiGe layer 2 and Si layer 3 on the active region 13 to form a two-layered semiconductor film 11 as shown in FIG. 4B. Here, in order to ensure that the above-described impurity distribution of boron in the semiconductor film 11 will be achieved by using activation annealing of a channel impurity region 14 and pocket regions 21 performed later, the SiGe layer 2 is formed thicker than the Si layer 3. For example the SiGe layer 2 is formed to a thickness of approximately 4 nm whereas the Si layer 3 is formed to a thickness of approximately 3 nm.

Figure 4C:
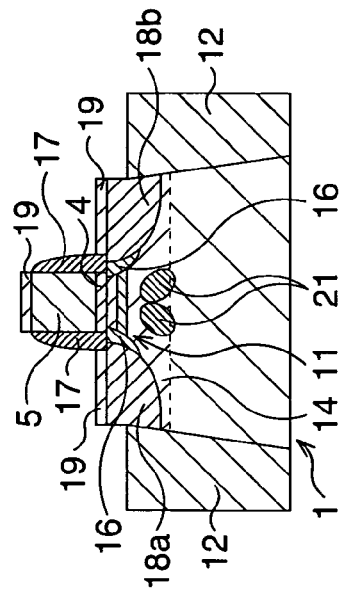

Then, a silicon oxide film, which forms a gate insulating film 4, is formed on the Si layer 3 to a thickness of approximately 1.5 nm as shown in FIG. 4C. A polycrystalline silicon film is then deposited on the gate insulating film 4 and is patterned to form a gate electrode 5. In order to adjust the impurity profile around the channel to suppress a short-channel effect, ions of a p-type impurity, boron herein, are implanted into the surface of the semiconductor film 11 and the Si substrate by using the gate electrode 5 as a mask to form a pair of pocket regions 21. Here, in order to achieve the concentration profile of the semiconductor film 11 described above, ion implantation is performed by controlling the acceleration energy and the tilt angle so that the peak of boron concentration occurs in a portion of the Si substrate 1 below the SiGe layer 2. In particular, a dose of $1\times10^{13}/cm^2$ of boron ions are implanted with an acceleration energy of 10 keV at a tilt angle of 45 degrees.

Figure 4D:
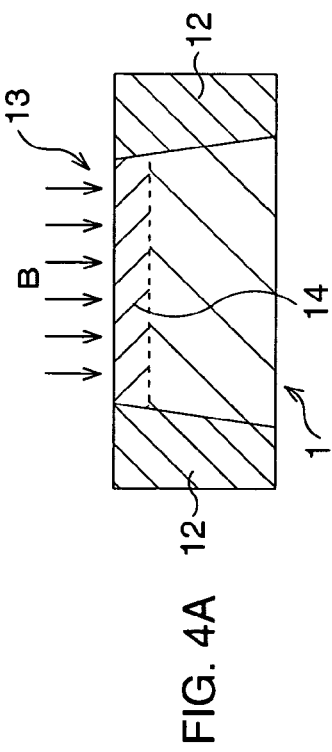

Then, the gate electrode 5 is used as a mask to implant a dose of $1\times10^{14}/cm^2$ of ions of an n-type impurity, arsenic (As)

herein, into the surface of the semiconductor 11 and the Si substrate 1 by using the gate electrode 5 as a mask with an acceleration energy of 5 keV at a tilt angle of 0 degrees to form a pair of extension regions 16 as shown in FIG. 4D.

Figure 4E:
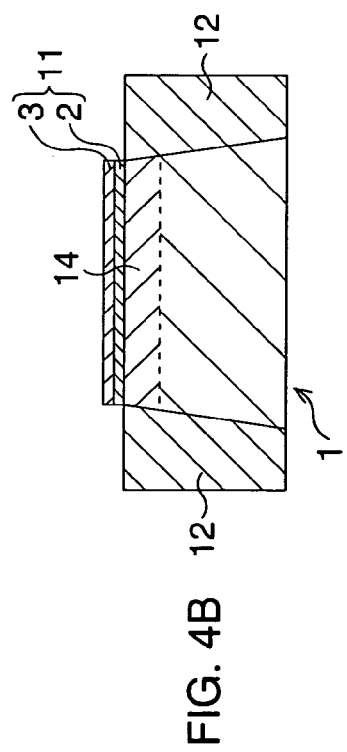

Then, an insulator film, a silicon oxide film herein, is deposited on the entire surface to cover the gate electrode 5 and anisotropic etching (etching back) is applied to the entire surface of the silicon oxide film so that the silicon oxide film is left only on both sides of the gate electrode 5, thus forming sidewall insulator films 17 as shown in FIG. 4E. Then, the gate electrode 5 and the sidewall insulator films 17 are used as a mask to implant a does of $1\times10^{15}/cm^2$ of ions of an n-type impurity, arsenic (As) herein, into the surface of the semiconductor film 11 and the Si substrate 1 with an acceleration energy of 30 keV at a tilt angle of 0 degrees to form a pair of a source region 18a and a drain region 18b that overlap a portion of the extension regions 16 and are deeper than the extension regions 16.

Then, activation annealing is performed at a temperature of 1,000° C. for one second to thermally diffuse the implanted impurities. During the activation annealing, the implanted ions of boron to form the channel impurity region 14 exhibit a higher diffusion coefficient in the SiGe layer 2 and a lower diffusion coefficient in the Si layer 3. Accordingly, a large amount of the boron diffuses from the channel impurity region 14 to the SiGe layer 2 whereas a small amount of the boron diffuses from the SiGe layer 2 to the Si layer 3. Similarly, a large amount of the boron ions implanted to form the pocket regions 21 diffuses from the pocket regions 21 to the SiGe layer 2 whereas a small fraction of the boron ions diffuses from the pocket regions 21 to the Si layer 3. As a result, the boron is distributed in the SiGe layer 2 with a higher concentration and distributed in the Si layer 3 with a lower concentration than that in the SiGe layer 2. Accordingly, the electric field in the Si layer 3 is reduced and therefore the Si layer 3 functions as an electron channel with a high mobility. Furthermore, higher-boron-concentration control in the SiGe layer 2 also inhibits adverse effects (such as a short-channel effect) of diffusion of arsenic from the extension regions 16 on the SiGe layer 2. This control holds promise of providing a high improvement in characteristics of transistors, especially of short-channel n-type MOS transistors in which ion implantation for forming pocket regions determines the channel impurity profile.

Figure 4F:
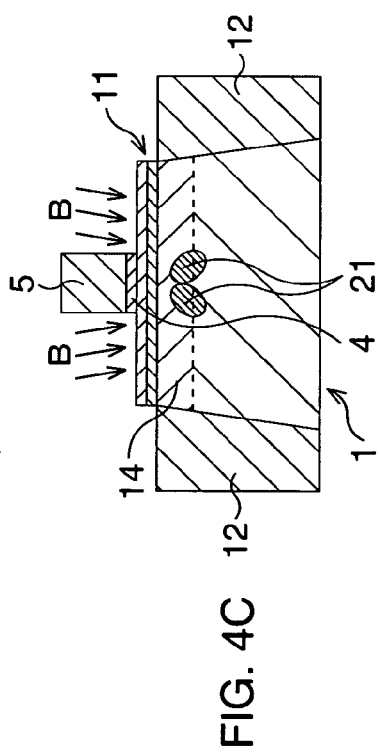

Then, a metal silicide, a Ni film herein, is formed on the entire surface and thermal treatment is applied to form a silicide (NiSi) film 19 on the gate electrode 5 and on the Si layer 3 in the source/drain regions 18a, 18b (salicidation) as shown in FIG. 4F. Then, an unreacted Ni film is removed, and inter-layer insulator films, contact holes, and a wiring layer are formed to complete the n-type MOS transistor.

As has been described, according to the second embodiment, the p-type impurity ion implantation for controlling $V_{th}$ and p-type impurity ion implantation for suppressing the short-channel effect in an n-type MOS transistor including a semiconductor film having a heterojunction structure with a compression strain structure can be used to make the concentration of the p-type impurity in the SiGe layer 2 higher than that in the Si layer 3 while controlling the threshold voltage. As a result, only the Si layer 3 functions as a channel, thereby increasing the mobility of electrons. Thus, a highly reliable n-type MOS transistor with improved transistor characteristics can be implemented easily and reliably.

Third Embodiment

In a third embodiment, ion implantation of a p-type impurity into an Si substrate for threshold voltage control and ion implantation of the p-type impurity for suppressing a short-channel effect are used as a control method for achieving a concentration distribution as shown in the right-hand part of FIG. 1A in a semiconductor film (the SiGe layer and Si layer) that forms a channel in an n-type MOS transistor. A p-type impurity, for example boron B, exhibits a higher diffusion coefficient in the SiGe layer and a lower diffusion coefficient in the Si layer. The difference in diffusion coefficient is used to thermally diffuse boron into the semiconductor film. Because of the difference in diffusion coefficient, the concentration of the boron in the SiGe layer becomes higher than that in the Si layer.

FIGS. 5A to 5F are schematic cross-sectional diagrams showing stepwise a method for manufacturing an n-type MOS transistor according to the third embodiment. In the third embodiment, a structure of the n-type MOS transistor will be described along with the manufacturing method.

Figure 5A:
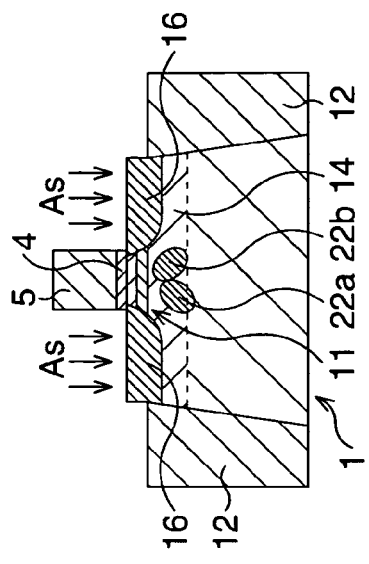
FIGS. 5A to 5F are schematic cross-sectional diagrams showing stepwise a method for manufacturing an n-type MOS transistor according to a third embodiment.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 13 as shown in FIG. 5A. Then, for the purpose of controlling the threshold voltage ($V_{th}$), a dose of $1\times10^{13}/cm^2$ of ions of a p-type impurity, which is boron herein, are implanted with an acceleration energy of 10 keV into the surface of the active region 13 to form a channel impurity region 14.

Figure 5B:
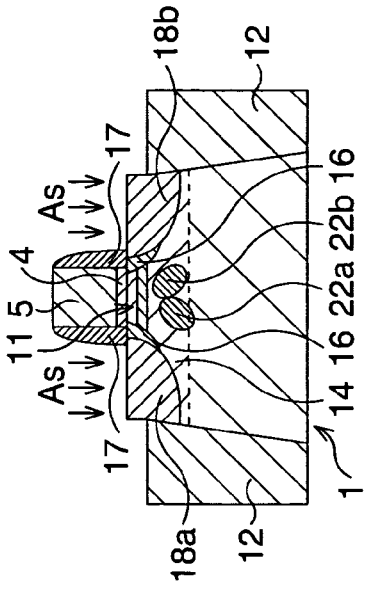

Then, a CVD method is used to selectively deposit a thin SiGe layer 2 and Si layer 3 on the active region 13 to form a two-layered semiconductor film 11 as shown in FIG. 5B. Here, in order to ensure that the above-described impurity distribution of boron in the semiconductor film 11 will be achieved by using activation annealing of a channel impurity region 14 and pocket regions 22a, 22b performed later, the SiGe layer 2 is formed thicker than the Si layer 3. For example the SiGe layer 2 is formed to a thickness of approximately 4 nm whereas the Si layer 3 is formed to a thickness of approximately 3 nm.

Figure 5C:
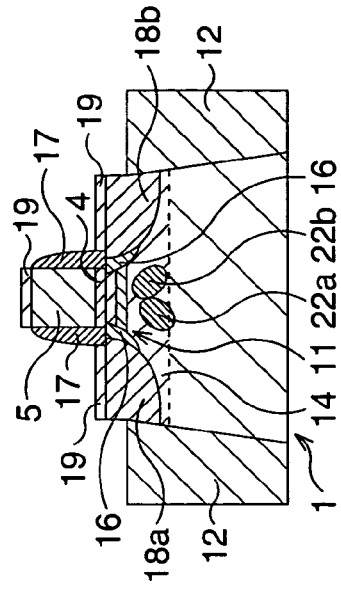

Then, a silicon oxide film, which forms a gate insulating film 4, is formed on the Si layer 3 to a thickness of approximately 1.5 nm as shown in FIG. 5C. A polycrystalline silicon film is then deposited on the gate insulating film 4 and patterned to form a gate electrode 5. In order to adjust the impurity profile around the channel to suppress a short-channel effect, ions of a p-type impurity, boron herein, are implanted into the surface of the semiconductor film 11 and the Si substrate 1 by using the gate electrode 5 as a mask to form a pair of pocket regions 22a and 22b. Here, in order to achieve the concentration profile of the semiconductor film 11 described above, ion implantation is performed by controlling the acceleration energy and the tilt angle so as to form asymmetric pocket regions 22a and 22b for left and right in which the peak of boron concentration occurs in a portion of the Si substrate 1 below the SiGe layer 2 only on the source side where the electric field is strong. In particular, for the pocket region 22a on the source side, an ion dose of $1\times10^{13}/cm^2$ is implanted with an acceleration energy of 30 keV at a tile angle of 40 degrees; whereas for the pocket region 22b on the drain side, an ion dose of $1\times10^{13}/cm^2$ is implanted with an acceleration energy of 10 keV at a tilt angle of 45 degrees.

Figure 5D:
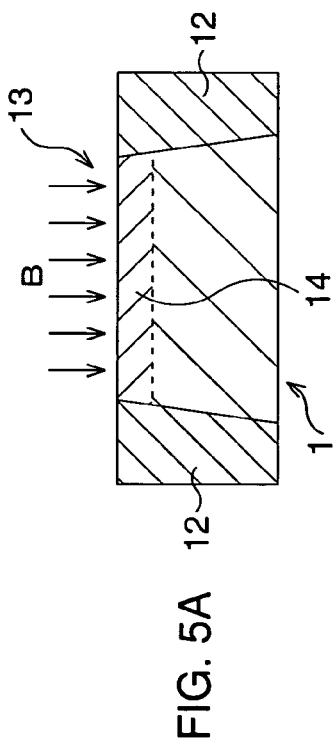

Then, the gate electrode 5 is used as a mask to implant a dose of $1\times10^{14}/cm^2$ of ions of an n-type impurity, arsenic herein, into the surface of the semiconductor film 11 and Si substrate 1 with an acceleration energy of 5 keV at a tilt angle of 0 degrees to form a pair of extension regions 16 as shown in FIG. 5D.

Figure 5E:
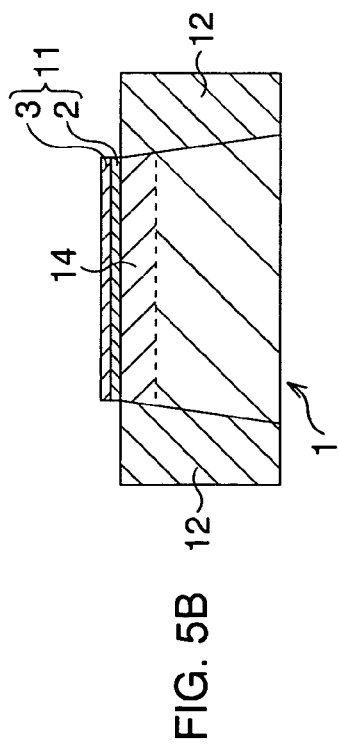

Then, an insulator film, a silicon oxide film herein, is deposited on the entire surface to cover the gate electrode 5 and anisotropic etching (etching back) is applied to the entire surface of the silicon oxide film so that the silicon oxide film is left only on both sides of the gate electrode 5, thus forming sidewall insulator films 17 as shown in FIG. 5E. Then, the gate electrode 5 and the sidewall insulator films 17 are used as a mask to implant a does of $1\times10^{15}/cm^2$ of ions of an n-type impurity, arsenic (As) herein, into the surface of the semiconductor film 11 and the Si substrate 1 with an acceleration energy of 30 keV at a tilt angle of 0 degrees to form a pair of a source region 18a and a drain region 18b that overlap portions of the extension regions 16 and are deeper than the extension regions 16.

Then, activation annealing is performed at a temperature of 1,000° C. for one second to thermally diffuse the implanted impurities. During the activation annealing, the implanted ions of boron to form the channel impurity region 14 exhibit a higher diffusion coefficient in the SiGe layer 2 and a lower diffusion coefficient in the Si layer 3. Accordingly, a large amount of the boron diffuses from the channel impurity region 14 to the SiGe layer 2 whereas a small fraction of the boron diffuses from the SiGe layer 2 to the Si layer 3. Similarly, a large amount of the boron ions implanted to form the pocket regions 22a and 22b diffuses from the pocket regions 22a and 22b to the SiGe layer 2, whereas a small fraction of the boron ions diffuses from the pocket regions 22a and 22b to the Si layer 3. As a result, the boron is distributed in the SiGe layer 2 with a higher concentration and distributed in the Si layer 3 with a lower concentration than that in the SiGe layer 2. In the third embodiment, the difference in concentration distribution between the SiGe layer 2 and the Si layer 3, especially on the source side, can be reliably provided because the pocket region 22a on the source side is formed in such a manner that the peak of boron concentration occurs in a portion of the Si substrate 1 below the SiGe layer 2. Accordingly, the electric field in the Si layer 3 is reduced and therefore the Si layer 3 functions as an electron channel with a high mobility. Furthermore, higher-boron-concentration control in the SiGe layer 2 also inhibits adverse effects (such as a short-channel effect) of diffusion of arsenic from the extension regions 16 on the SiGe layer 2. This control holds promise of providing a higher improvement in characteristics of transistors, especially of short-channel n-type MOS transistors in which ion implantation for forming pocket regions determines the channel impurity profile.

Figure 5F:
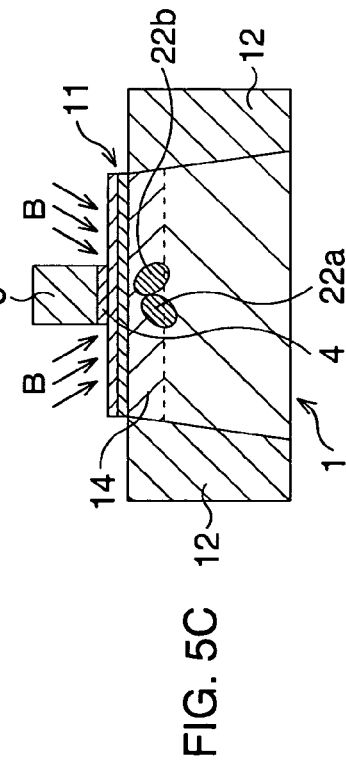

Then, a metal silicide, a Ni film herein, is formed on the entire surface and thermal treatment is applied to form a silicide (NiSi) film 19 on the gate electrode 5 and on the Si layer 3 in the source/drain regions 18a, 18b (salicidation) as shown in FIG. 5F. Then, an unreacted Ni film is removed, then inter-layer insulator films, contact holes, and a wiring layer are formed to complete the n-type MOS transistor.

As has been described, according to the third embodiment, the p-type impurity ion implantation for controlling $V_{th}$ and p-type impurity ion implantation for suppressing the short-channel effect in an n-type MOS transistor including a heterojunction semiconductor film having a compression strain structure can be used to make the concentration of the p-type impurity in the SiGe layer 2 higher than that in the Si layer 3 while controlling the threshold voltage, with special consideration given to the source side where the electric field is strong. As a result, only the Si layer 3 functions as a channel, thereby increasing the mobility of electrons. Thus, a highly reliable n-type MOS transistor with improved transistor characteristics can be implemented easily and reliably.

Fourth Embodiment

In a fourth embodiment, ion implantation of a p-type impurity into an Si substrate for threshold voltage control and ion implantation of the p-type impurity for suppressing a short-channel effect are used as a control method for achieving the concentration distribution as shown in the right-hand part of FIG. 1A in a semiconductor film (the SiGe layer and Si layer) that forms a channel in an n-type MOS transistor. A p-type impurity, for example boron B, exhibits a higher diffusion coefficient in the SiGe layer and a lower diffusion coefficient in the Si layer. The difference in diffusion coefficient is used to thermally diffuse boron into the semiconductor film. Because of the difference in diffusion coefficient, the concentration of the boron in the SiGe layer becomes higher than that in the Si layer.

FIGS. 6A to 6F are schematic cross-sectional diagrams showing stepwise a method for manufacturing an n-type MOS transistor according to the fourth embodiment. In the fourth embodiment, a structure of the n-type MOS transistor will be described along with the manufacturing method.

Figure 6A:
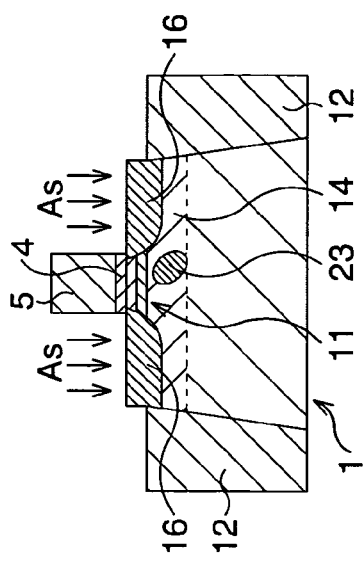
FIGS. 6A to 6F are schematic cross-sectional diagrams showing stepwise a method for manufacturing an n-type MOS transistor according to a fourth embodiment.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 13 as shown in FIG. 6A. Then, for the purpose of controlling the threshold voltage ($V_{th}$), a dose of $1\times10^{13}/cm^2$ of ions of p-type impurity, which is boron herein, are implanted with an acceleration energy of 10 keV into the surface of the active region 13 to form a channel impurity region 14.

Figure 6D:
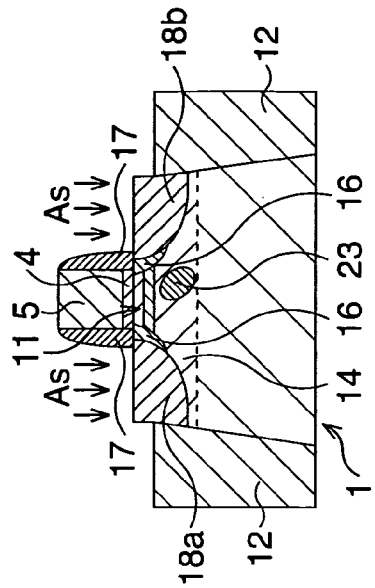
Figure 6E:
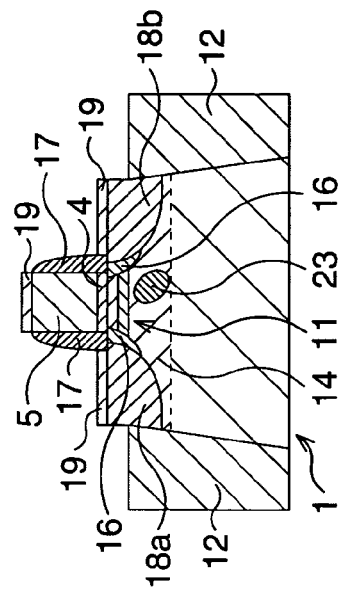
Figure 6B:
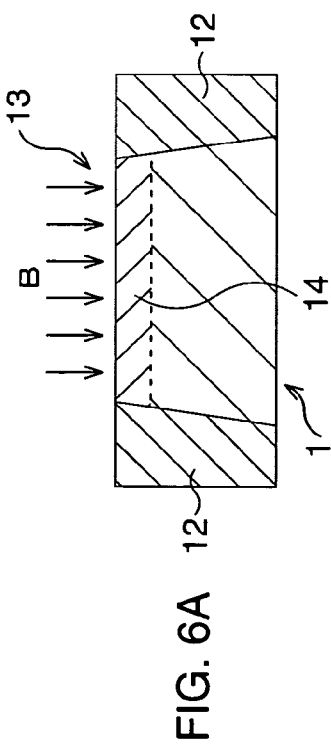

Then, a CVD method is used to selectively deposit a thin SiGe layer 2 and Si layer 3 on the active region 13 to form a two-layered semiconductor film 11 as shown in FIG. 6B. Here, in order to ensure that the above-described impurity distribution of boron in the semiconductor film 11 will be achieved by using activation annealing of a channel impurity region 14 and a pocket region 23 performed later, the SiGe layer 2 is formed thicker than the Si layer 3. For example the SiGe layer 2 is formed to a thickness of approximately 4 nm whereas the Si layer 3 is formed to a thickness of approximately 3 nm.

Figure 6C:
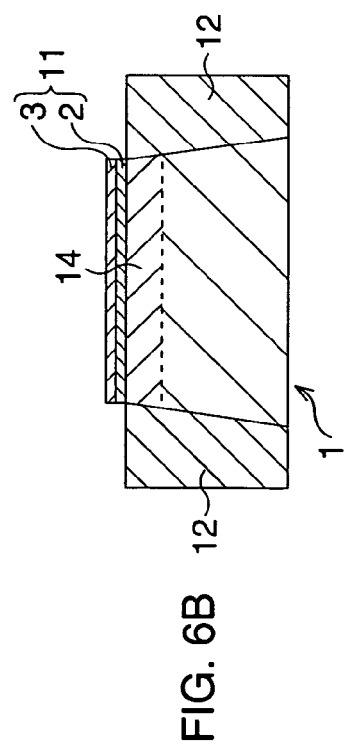

Then, a silicon oxide film, which forms a gate insulating film 4, is formed on the Si layer 3 to a thickness of approximately 1.5 nm as shown in FIG. 6C. A polycrystalline silicon film is then deposited on the gate insulating film 4 and patterned to form a gate electrode 5. In order to adjust the impurity profile around the channel to suppress a short-channel effect, ions of a p-type impurity, boron herein, are implanted into the surface of the semiconductor film 11 and the Si substrate only on the drain side by using the gate electrode 5 as a mask to form a pocket region 23. Here, in order to achieve the concentration profile of the semiconductor film 11 described above, ion implantation is performed by controlling the acceleration energy and the tilt angle so as to form the pocket region 23 only on the drain side. In particular, an ion dose of $1\times10^{13}/cm^2$ is implanted only on the drain side with an acceleration energy of 10 keV at a tilt angle of 45 degrees.

Then, the gate electrode 5 is used as a mask to implant a dose of $1\times10^{14}/cm^2$ of ions of an n-type impurity, arsenic (As) herein, into the surface of the semiconductor film 11 and Si substrate 1 with an acceleration energy of 5 keV at a tilt angle of 0 degrees to form a pair of extension regions 16 as shown in FIG. 6D.

Then, an insulator film, a silicon oxide film herein, is deposited on the entire surface to cover the gate electrode 5 and anisotropic etching (etching back) is applied to the entire surface of the silicon oxide film so that the silicon oxide film is left only on both sides of the gate electrode 5, thus forming sidewall insulator films 17 as shown in FIG. 6E. Then, the gate electrode 5 and the sidewall insulator films 17 are used as a mask to implant a does of $1\times10^{15}/cm^2$ of ions of an n-type impurity, arsenic (As) herein, into the surface of the semiconductor film 11 and the Si substrate 1 with an acceleration energy of 30 keV at a tilt angle of 0 degrees to form a pair of a source region 18a and a drain region 18b that overlap portions of the extension regions 16 and are deeper than the extension regions 16.

Then, activation annealing is performed at a temperature of 1,000° C. for one second to thermally diffuse the implanted ions of impurities. During the activation annealing, the implanted ions of boron to form the channel impurity region 14 exhibit a higher diffusion coefficient in the SiGe layer 2 and a lower diffusion coefficient in the Si layer 3. Accordingly, a large amount of the boron diffuses from the channel impurity region 14 to the SiGe layer 2, whereas a small fraction of the boron diffuses from the SiGe layer 2 to the Si layer 3. As a result, the boron is distributed in the SiGe layer 2 with a higher concentration and distributed in the Si layer 3 with a lower concentration than that in the SiGe layer 2. Accordingly, the electric field in the Si layer 3 is reduced and therefore the Si layer 3 functions as an electron channel with a high mobility. In this case, the ion implantation in the pocket region is required especially on the drain side and the difference in the concentration distribution between the SiGe layer 2 and the Si layer 3 is not so important on the drain side. Therefore, the pocket region 23 is formed only on the drain side in the fourth embodiment, thereby suppressing the short-channel effect without increasing the concentration of boron in the Si layer 3 on the source side. Furthermore, higher-boron-concentration control in the SiGe layer 2 also inhibits adverse effects (such as a short-channel effect) of diffusion of arsenic from the extension regions 16 on the SiGe layer 2. This control holds promise of providing a higher improvement in characteristics of transistors, especially of short-channel n-type MOS transistors in which ion implantation for forming pocket regions determines the channel impurity profiles.

Figure 6F:
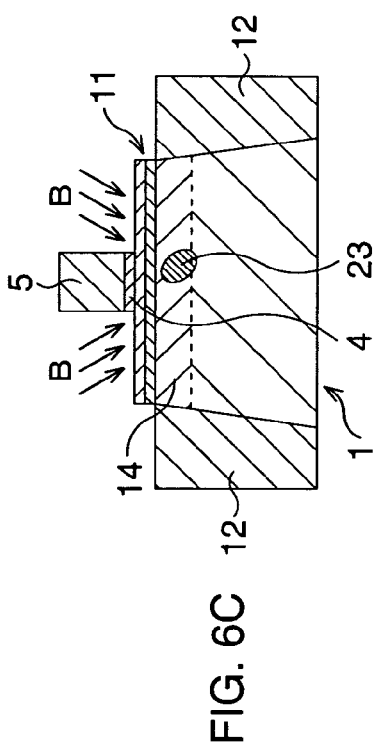

Then, a metal silicide, a Ni film herein, is formed on the entire surface and thermal treatment is applied to form a silicide (NiSi) film 19 on the gate electrode 5 and on the Si layer 3 in the source/drain regions 18a, 18b (salicidation) as shown in FIG. 6F. Then, an unreacted Ni film is removed, then inter-layer insulator films, contact holes, and a wiring layer are formed to complete the n-type MOS transistor.

As has been described, according to the fourth embodiment, the p-type impurity ion implantation for controlling $V_{th}$ and the p-type impurity ion implantation for suppressing the short-channel effect in an n-type MOS transistor including a heterojunction semiconductor film having a compression strain structure can be used to make the concentration of the p-type impurity in the SiGe layer 2 higher than that in the Si layer 3 while controlling the threshold voltage. As a result, only the Si layer 3 functions as a channel, thereby increasing the mobility of electrons. Thus, a highly reliable n-type MOS transistor with improved transistor characteristics can be implemented easily and reliably.

Fifth Embodiment

In a fifth embodiment, ion implantation of an n-type impurity for suppressing a short-channel effect is used as a control method for providing a higher concentration distribution of the n-type impurity in a SiGe layer and a lower concentration distribution of the n-type impurity in a Si layer in a semiconductor film that forms a channel in a p-type MOS transistor. An n-type impurity, for example arsenic (As), exhibits a higher diffusion coefficient in the SiGe layer and a lower diffusion coefficient in the Si layer. The difference in diffusion coefficient is used to thermally diffuse arsenic to the semiconductor film. The difference in diffusion coefficient makes the concentration of the arsenic in the SiGe layer higher than in the Si layer.

FIGS. 7A to 7F are schematic cross-sectional diagrams showing stepwise a method for manufacturing a p-type MOS transistor according to the fifth embodiment. In the fifth embodiment, a structure of the p-type MOS transistor will be described along with the manufacturing method.

Figure 7A:
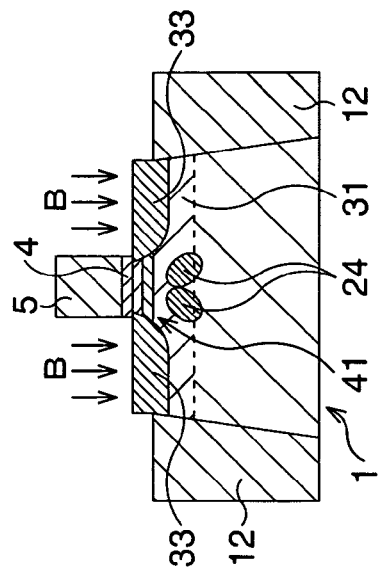
FIGS. 7A to 7F are schematic cross-sectional diagrams showing stepwise a method for manufacturing an n-type MOS transistor according to a fifth embodiment.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 31 as shown in FIG. 7A. Then, for the purpose of controlling the threshold voltage ($V_{th}$), a dose of $1\times10^{13}/cm^2$ of ions of an n-type impurity, which is arsenic herein, is implanted with an acceleration energy of 100 keV into the surface of the active region 31 to form a channel impurity region 32.

Figure 7B:
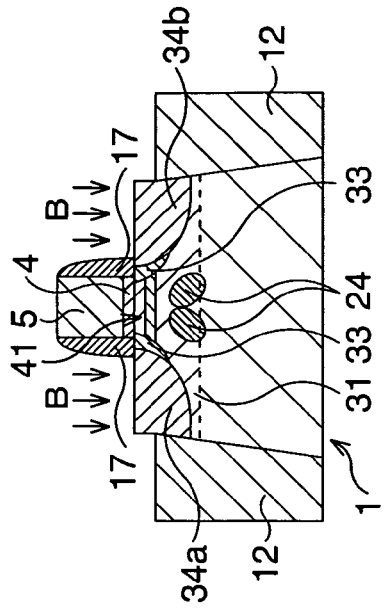

Then, a CVD method is used to selectively deposit a thin SiGe layer 42 and Si layer 43 on the active region 31 to form a two-layered semiconductor film 41 as shown in FIG. 7B. Here, in order to ensure that the impurity distribution of arsenic in the semiconductor film 41 described earlier will be achieved by using activation annealing of a pocket region 24 performed later, the SiGe layer 42 is formed thicker than the Si layer 43. For example, the SiGe layer 42 is formed to a thickness of approximately 4 nm whereas the Si layer 43 is formed to a thickness of approximately 3 nm.

Figure 7C:
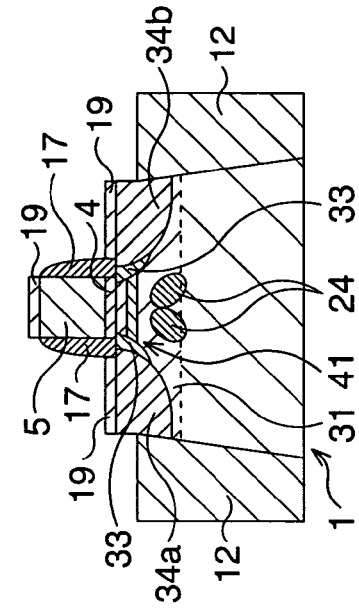

Then, a silicon oxide film, which forms a gate insulating film 4, is formed on the Si layer 43 to a thickness of approximately 1.5 nm as shown in FIG. 7C. A polycrystalline silicon film is then deposited on the gate insulating film 4 and is patterned to form a gate electrode 5. In order to adjust the impurity profile around the channel to suppress a short-channel effect, the gate electrode 5 is used as a mask to implant ions of an n-type impurity, arsenic herein, into the surface of the semiconductor film 41 and the Si substrate 1 to form a pair of pocket regions 24. In order to provide the concentration profile of the semiconductor film 41 described earlier, ion implantation is performed by controlling the acceleration energy and the tilt angle so that the peak of arsenic concentration occurs in a portion of the Si substrate 1 below the SiGe layer 42. In particular, an ion dose of $1\times10^{13}/cm^2$ is implanted with an acceleration energy of 50 keV at a tilt angle of 40 degrees.

Figure 7D:
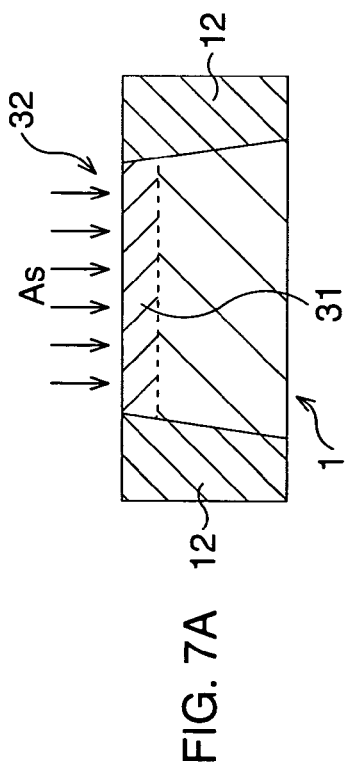

Then, the gate electrode 5 is used as a mask to implant a dose of $1\times10^{14}/cm^2$ of ions of a p-type impurity, boron B herein, into the surface of the semiconductor film 41 and Si substrate 1 with an acceleration energy of 1 keV at a tilt angle of 0 degrees to form a pair of extension regions 33 as shown in FIG. 7D.

Figure 7E:
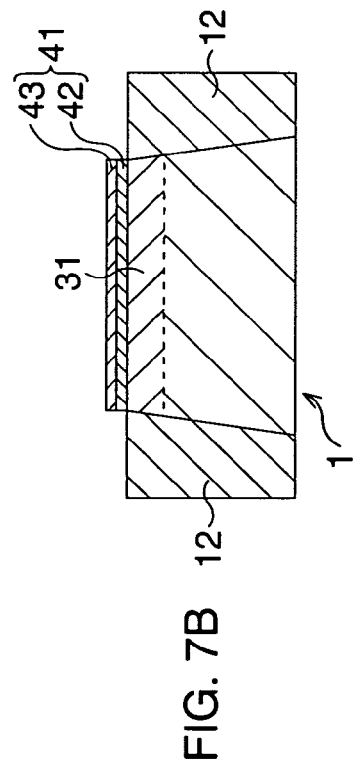

Then, an insulator film, a silicon oxide film herein, is deposited on the entire surface to cover the gate electrode 5 and anisotropic etching (etching back) is applied to the entire surface of the silicon oxide film so that the silicon oxide film is left only both side-surfaces of the gate electrode 5, thus forming sidewall insulator films 17 as shown in FIG. 7E. Then, the gate electrode 5 and the sidewall insulator films 17 are used as a mask to implant a dose $1\times10^{15}/\text{cm}^2$ of ions of a p-type impurity, boron B herein, into the surface of the semiconductor film 41 and Si substrate 1 with an acceleration energy of 5 keV at a tilt angle of 0 degrees to form a pair of a source region 34a and a drain region 34b that overlap a portion of the extension regions 33 and are deeper than the extension regions 33.

Then, activation annealing is performed at temperature of 1,000° C. for one second to thermally diffuse the implanted impurities. During the activation annealing, the ions of arsenic implanted to form the pocket region 24 exhibit a higher diffusion coefficient in the SiGe layer 42 and a lower diffusion coefficient in the Si layer 43. Accordingly, a large amount of the implanted arsenic diffuses from the pocket region 24 to the SiGe layer 42, whereas a small fraction diffuses from the pocket region 24 to the Si layer 43. As a result, the arsenic is distributed in the SiGe layer 42 with a higher concentration and distributed in the Si layer 43 with a lower concentration than the SiGe layer 42. Accordingly, the electric field in the Si layer 43 is reduced and the SiGe layer 42 and the Si layer 43 are prevented from becoming parallel channels and therefore only the SiGe layer 42 functions as a positive hole channel with a high mobility. It is to be expected that a higher improvement in characteristics will be provided especially in short-channel p-type MOS transistors in which ion implantation for forming a pocket region determines their channel impurity profiles.

Figure 7F:
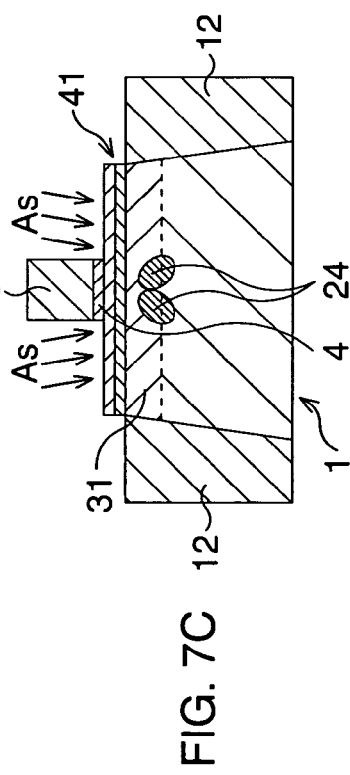

Then, a metal silicide, a Ni film herein, is formed on the entire surface and thermal treatment is applied to it to form a silicide (NiSi) film 19 on the gate electrode 5 and on the Si layer 43 in the source/drain region 34a and 34b (salicidation) as shown in FIG. 7F. Then, an unreacted Ni film is removed, and inter-layer films, contact holes, and a wiring layer are formed to complete the p-type MOS transistor.

As has been described, according to the fifth embodiment, the n-type impurity ion implantation for suppressing the short-channel effect in an p-type MOS transistor including a heterojunction semiconductor film having a compression-strain structure can be used to make the concentration of the n-type impurity in the SiGe layer 42 higher than that in the Si layer 43. As a result, only the SiGe layer 42 functions as a channel, thereby increasing the mobility of holes. Thus, a highly reliable p-type MOS transistor with improved transistor characteristics can be implemented easily and reliably.

Sixth Embodiment

In a sixth embodiment, ion implantation of an n-type impurity for suppressing a short-channel effect is used as a control method for providing a higher concentration distribution of the n-type impurity in a SiGe layer and a lower concentration distribution of the n-type impurity in a Si layer in a semiconductor film that forms a channel in a p-type MOS transistor. An n-type impurity, for example arsenic (As), exhibits a higher diffusion coefficient in the SiGe layer and a lower diffusion coefficient in the Si layer. The difference in diffusion coefficient is used to thermally diffuse arsenic to the semiconductor film. The difference in diffusion coefficient makes the concentration of the arsenic in the SiGe layer higher than in the Si layer.

FIGS. 8A to 8F are schematic cross-sectional diagrams showing stepwise a method for manufacturing a p-type MOS transistor according to the sixth embodiment. In the sixth embodiment, a structure of the p-type MOS transistor will be described along with the manufacturing method.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 31 as shown in FIG. 8A. Then, for the purpose of controlling the threshold voltage ($V_{th}$), a dose of $1\times10^{13}/\text{cm}^2$ of ions of an n-type impurity, which is arsenic herein, is implanted with an acceleration energy of 100 keV into the surface of the active region 31 to form a channel impurity region 32.

Then, a CVD method is used to selectively deposit a thin SiGe layer 42 and Si layer 43 on the active region 31 to form a two-layered semiconductor film 41 as shown in FIG. 8B. Here, in order to ensure that the impurity distribution of arsenic described earlier will be achieved by using activation annealing of pocket regions 24a, 24b performed later, the SiGe layer 42 is formed thicker than the Si layer 43. For example, the SiGe layer 42 is formed to a thickness of approximately 4 nm whereas the Si layer 43 is formed to a thickness of approximately 3 nm.

Then, a silicon oxide film, which forms a gate insulating film 4, is formed on the Si layer 43 to a thickness of approximately 1.5 nm as shown in FIG. 8C. A polycrystalline silicon film is then deposited on the gate insulating film 4 and is patterned to form a gate electrode 5. In order to adjust the impurity profile around the channel to suppress a short-channel effect, the gate electrode 5 is used as a mask to implant an n-type impurity, arsenic herein, into the surface of in the semiconductor film 41 and the Si substrate 1 to form a pair of pocket regions 25a, 25b for left and right. In order to provide the concentration profile of the semiconductor film 41 described earlier, ion implantation is performed by controlling the acceleration energy and the tilt angle so that the peak of arsenic concentration occurs in a portion of the Si substrate 1 below the SiGe layer 42 only on the source side where the electric field is especially strong to form a symmetric pocket regions 25a and 25b for left and right. In particular, for the pocket region 25a on the source side, an ion dose of $1\times10^{13}/\text{cm}^2$ is implanted with an acceleration energy of 50 keV at a tilt angle of 40 degrees; whereas for the pocket region 25b on the drain side, an ion dose of $1\times10^{13}/\text{cm}^2$ is implanted with an acceleration energy of 30 keV at a tilt angle of 45 degrees.

Then, the gate electrode 5 is used as a mask to implant a dose of $1\times10^{14}/\text{cm}^2$ of ions of a p-type impurity, boron B herein, into the surface of the semiconductor film 41 and Si substrate 1 with an acceleration energy of 1 keV at a tilt angle of 0 degrees to form a pair of extension regions 33 as shown in FIG. 8D.

Then, an insulator film, a silicon oxide film herein, is deposited on the entire surface to cover the gate electrode 5 and anisotropic etching (etching back) is applied to the entire surface of the silicon oxide film so that the silicon oxide film is left only both side-surfaces of the gate electrode 5, thus forming sidewall insulator films 17 as shown in FIG. 8E. Then, the gate electrode 5 and the sidewall insulator films 17 are used as a mask to implant a dose $1\times10^{15}/\text{cm}^2$ of ions of a p-type impurity, boron B herein, into the surface of the semiconductor film 41 and the Si substrate 1 with an acceleration energy of 5 keV at a tilt angle of 0 degrees to form a pair of a source region 34a and a drain region 34b that overlap a portion of the extension regions 33 and are deeper than the extension regions 33.

Then, activation annealing is performed at temperature of 1,000° C. for one second to thermally diffuse the implanted impurities. During the activation annealing, the ions of arsenic implanted to form the pocket regions 25a, 25b exhibit a higher diffusion coefficient in the SiGe layer 42 and a lower diffusion coefficient in the Si layer 43. Accordingly, a large amount of the implanted arsenic diffuses from the pocket regions 25a, 25b to the SiGe layer 42, whereas a small fraction diffuses from the pocket regions 25a, 25b to the Si layer 43. As a result, the arsenic is distributed in the SiGe layer 42 with a higher concentration and distributed in the Si layer 43 with a lower concentration than the SiGe layer 42. In the sixth embodiment, the difference in concentration distribution between the SiGe layer 42 and the Si layer 43, especially on the source side, can be reliably provided because the pocket region 25a on the source side is formed in such a manner that the peak of boron concentration appears in a portion of the Si substrate 1 below the SiGe layer 42. Accordingly, the electric field in the Si layer 43 is reduced and the SiGe layer 42 and Si layer 43 are prevented from becoming parallel channels and therefore only the SiGe layer 42 functions as a positive hole channel with a high mobility. It is to be expected that a higher improvement in characteristics will be provided especially in short-channel p-type MOS transistors in which ion implantation for forming pocket regions determines their channel impurity profiles.

Then, a metal silicide, a Ni film herein, is formed on the entire surface and thermal treatment is applied to it to form a silicide (NiSi) film 19 on the gate electrode 5 and on the Si layer 43 in the source/drain region 34a and 34b (salicidation) as shown in FIG. 8F. Then, an unreacted Ni film is removed, and inter-layer films, contact holes, and a wiring layer are formed to complete the p-type MOS transistor.

As has been described, according to the sixth embodiment, the n-type impurity ion implantation for suppressing the short-channel effect in an p-type MOS transistor including a heterojunction semiconductor film having a compression-strain structure can be used to make the concentration of the n-type impurity in the SiGe layer 42 higher than that in the Si layer 43 with special consideration given to the source side where the electric field is strong. As a result, only the SiGe layer 42 functions as a channel, thereby increasing the mobility of holes. Thus, a highly reliable p-type MOS transistor with improved transistor characteristics can be implemented easily and reliably.

Seventh Embodiment

In a seventh embodiment, ion implantation of an n-type impurity for suppressing a short-channel effect is used as a control method for providing a higher concentration distribution of the n-type impurity in a SiGe layer and a lower concentration distribution of the n-type impurity in a Si layer in a semiconductor film that forms a channel in a p-type MOS transistor. An n-type impurity, for example arsenic (As), exhibits a higher diffusion coefficient in the SiGe layer and a lower diffusion coefficient in the Si layer. The difference in diffusion coefficient is used to thermally diffuse arsenic to the semiconductor film. The difference in diffusion coefficient makes the concentration of the arsenic in the SiGe layer higher than in the Si layer.

FIGS. 9A to 9F are schematic cross-sectional diagrams showing stepwise a method for manufacturing a p-type MOS transistor according to the seventh embodiment. In the seventh embodiment, a structure of the p-type MOS transistor will be described along with the manufacturing method.

Figure 9A:
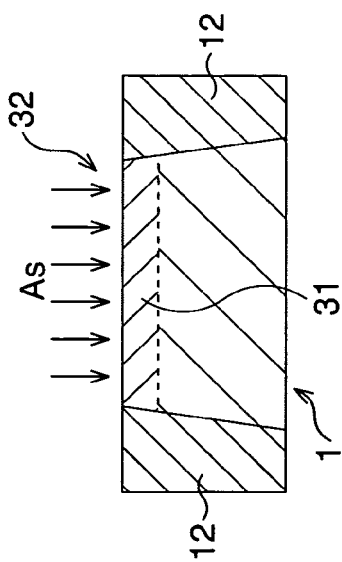
FIGS. 9A to 9F are schematic cross-sectional diagrams showing stepwise a method for manufacturing an n-type MOS transistor according to a seventh embodiment.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 31 as shown in FIG. 9A. Then, for the purpose of controlling the threshold voltage ($V_{th}$), a dose of $1\times10^{13}/cm^2$ of ions of an n-type impurity, which is arsenic herein, is implanted with an acceleration energy of 100 keV into the surface of the active region 31 to form a channel impurity region 32.

Figure 9B:
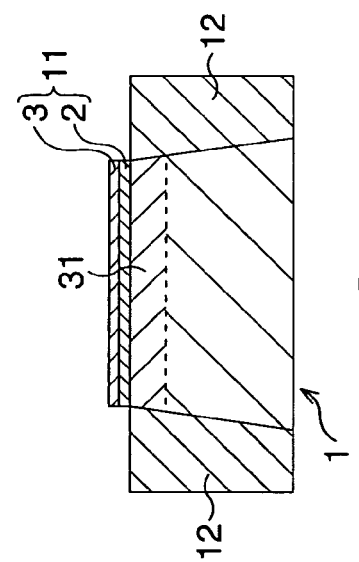

Then, a CVD method is used to selectively deposit a thin SiGe layer 42 and Si layer 43 on the active region 31 to form a two-layered semiconductor film 41 as shown in FIG. 9B. Here, in order to ensure that the impurity distribution of boron described earlier will be achieved by using activation annealing of pocket region 26 performed later, the SiGe layer 42 is formed thicker than the Si layer 43. For example, the SiGe layer 42 is formed to a thickness of approximately 4 nm whereas the Si layer 43 is formed to a thickness of approximately 3 nm.

Figure 9C:
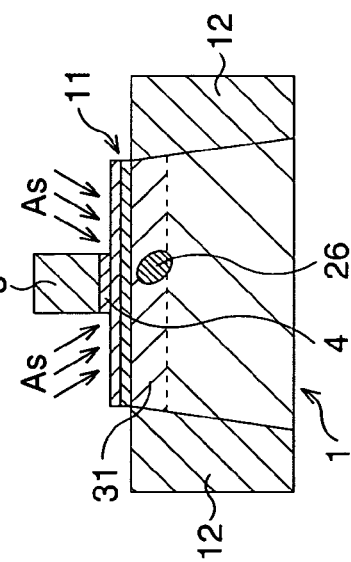

Then, a silicon oxide film, which forms a gate insulating film 4, is formed on the Si layer 43 to a thickness of approximately 1.5 nm as shown in FIG. 9C. A polycrystalline silicon film is then deposited on the gate insulating film 4 and is patterned to form a gate electrode 5. In order to adjust the impurity profile around the channel to suppress a short-channel effect, ions of an n-type impurity, arsenic herein, are implanted into the surface of the semiconductor film 11 and the Si substrate 1 only on the drain side by using the gate electrode 5 as a mask to form a pocket region 26. Here, in order to achieve the concentration profile of the semiconductor film 41 described above, ion implantation is performed by controlling the acceleration energy and the tilt angle so as to form the pocket region 26 only on the drain side. In particular, an ion dose of $1\times10^{13}/cm^2$ is implanted only on the drain side with an acceleration energy of 10 keV at a tilt angle of 45 degrees.

Figure 9D:
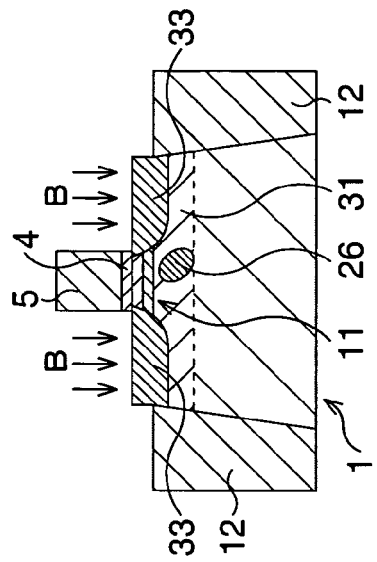

Then, the gate electrode 5 is used as a mask to implant a dose of $1\times10^{14}/cm^2$ of ions of a p-type impurity, boron B herein, into the surface of the semiconductor film 41 and the Si substrate 1 with an acceleration energy of 1 keV at a tilt angle of 0 degrees to form a pair of extension regions 33 as shown in FIG. 9D.

Figure 9E:
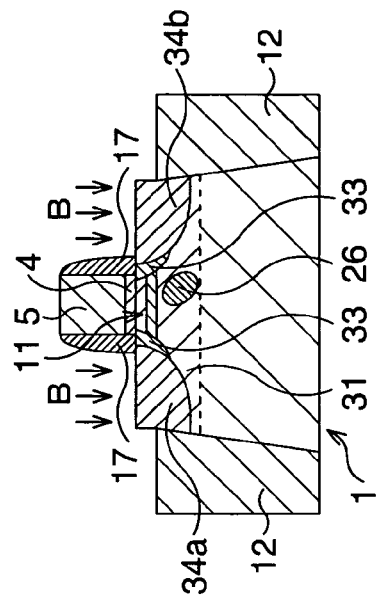

Then, an insulator film, a silicon oxide film herein, is deposited on the entire surface to cover the gate electrode 5 and anisotropic etching (etching back) is applied to the entire surface of the silicon oxide film so that the silicon oxide film is left only on both sides of the gate electrode 5, thus forming sidewall insulator films 17 as shown in FIG. 9E. Then, the gate electrode 5 and the sidewall insulator films 17 are used as a mask to implant a does of $1\times10^{15}/cm^2$ of ions of an p-type impurity, boron B herein, into the surface of the semiconductor film 41 and the Si substrate 1 with an acceleration energy of 5 keV at a tilt angle of 0 degrees to form a pair of a source region 34a and a drain region 34b that overlap a portion of the extension regions 33 and are deeper than the extension regions 33.

Then, activation annealing is performed at a temperature of 1,000° C. for one second to thermally diffuse the implanted impurities. During the activation annealing, the implanted ions of arsenic to form the pocket region 26 exhibit a higher diffusion coefficient in the SiGe layer 42 and a lower diffusion coefficient in the Si layer 43. Accordingly, a large amount of the arsenic diffuses from the pocket region 26 to the SiGe layer 42 whereas a small fraction of the arsenic diffuses from pocket region 26 to the Si layer 43. As a result, the arsenic is distributed in the SiGe layer 42 with a higher concentration and distributed in the Si layer 43 with a lower concentration than that in the SiGe layer 42. Accordingly, the electric field in the Si layer 43 is reduced and the SiGe layer 42 and Si layer 43 are prevented from becoming parallel channels and therefore the Si layer 43 functions as an electron channel with a high mobility. In this case, the ion implantation in the pocket region 26 is required especially on the drain side and the difference in the concentration distribution between the SiGe layer 42 and the Si layer 43 is not so important on the drain side. Therefore, in the seventh embodiment, the pocket region 26 is formed only on the drain side, thereby suppressing the short-channel effect without increasing the concentration of arsenic in the Si layer 43 on the source side. This control holds promise of providing a higher improvement in characteristics of transistors, especially of short-channel p-type MOS transistors in which ion implantation for forming a pocket region determines the channel impurity profiles.

Figure 9F:
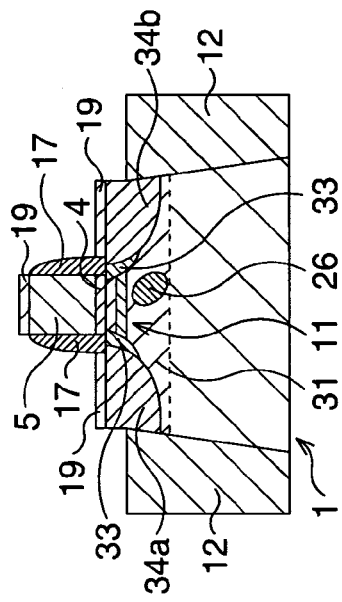

Then, a metal silicide, a Ni film herein, is formed on the entire surface and thermal treatment is applied to form a silicide (NiSi) film 19 on the gate electrode 5 and on the Si layer 43 in the source/drain regions 34a, 34b (salicidation) as shown in FIG. 9F. Then, an unreacted Ni film is removed, then inter-layer insulator films, contact holes, and a wiring layer are formed to complete the p-type MOS transistor.

As has been described, according to the seventh embodiment, the n-type impurity ion implantation for suppressing the short-channel effect in an p-type MOS transistor including a heterojunction semiconductor film having a compression strain structure can be used to make the concentration of the n-type impurity in the SiGe layer 42 higher than that in the Si layer 43 with special consideration given to the source side where the electric field is strong. As a result, only the SiGe layer 42 functions as a channel, thereby increasing the mobility of holes. Thus, a highly reliable p-type MOS transistor with improved transistor characteristics can be implemented easily and reliably.

Eighth Embodiment

In an eighth embodiment, ion implantation of an n-type impurity for suppressing a short-channel effect is used as a control method for providing a higher concentration distribution of the n-type impurity in a SiGe layer and a lower concentration distribution of the n-type impurity in a Si layer in a semiconductor film that forms a channel in a p-type MOS transistor. An n-type impurity, for example arsenic (As), exhibits a higher diffusion coefficient in the SiGe layer and a lower diffusion coefficient in the Si layer. The difference in diffusion coefficient is used to thermally diffuse arsenic to the semiconductor film. The difference in diffusion coefficient makes the concentration of the arsenic in the SiGe layer higher than in the Si layer.

FIGS. 10A to 10F are schematic cross-sectional diagrams showing stepwise a method for manufacturing a p-type MOS transistor according to the eighth embodiment. In the eighth embodiment, a structure of the p-type MOS transistor will be described along with the manufacturing method.

Figure 10A:
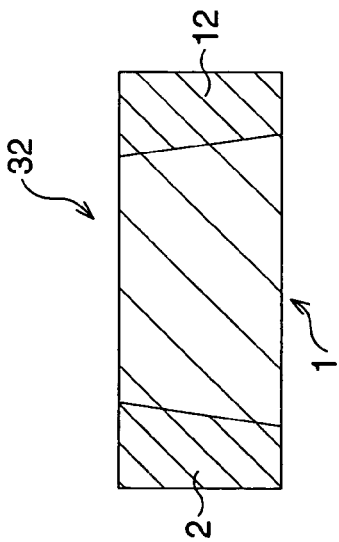
FIGS. 10A to 10F are schematic cross-sectional diagrams showing stepwise a method for manufacturing an n-type MOS transistor according to an eighth embodiment.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 31 as shown in FIG. 10A. Doping with an n-type impurity for the purpose of controlling the threshold voltage ($V_{th}$) is not performed in the eighth embodiment.

Figure 10B:
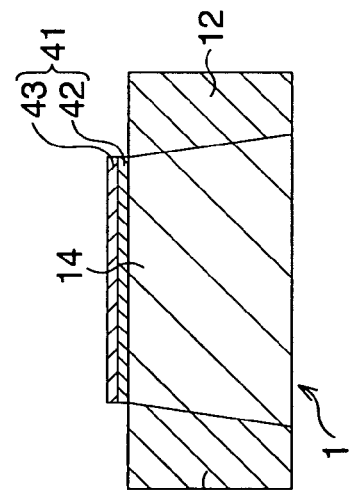

Then, a CVD method is used to selectively deposit a thin SiGe layer 42 and Si layer 43 on the active region 31 to form a two-layered semiconductor film 41 as shown in FIG. 10B. Here, in order to ensure that the impurity distribution of arsenic in the semiconductor film 41 described earlier will be achieved by using activation annealing of a pocket region 27 performed later, the SiGe layer 42 is formed thicker than the Si layer 43. For example, the SiGe layer 42 is formed to a thickness of approximately 4 nm whereas the Si layer 43 is formed to a thickness of approximately 3 nm.

Figure 10C:
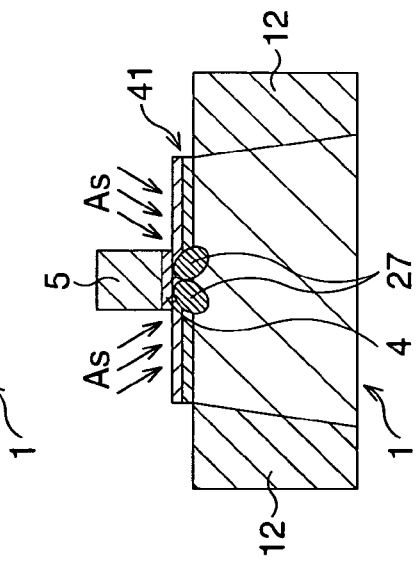

Then, a silicon oxide film, which forms a gate insulating film 4, is formed on the Si layer 43 to a thickness of approximately 1.5 nm as shown in FIG. 10C. A polycrystalline silicon film is then deposited on the gate insulating film 4 and is patterned to form a gate electrode 5. In order to adjust the impurity profile around the channel to suppress a short-channel effect, the gate electrode 5 is used as a mask to implant ions of an n-type impurity, arsenic herein, into the surface of the semiconductor film 41 and Si substrate 1 to form a pair of pocket regions 27. In order to provide the concentration profile of the semiconductor film 41 described earlier, ion implantation is performed by controlling the acceleration energy and the tilt angle so that the peak of boron concentration occurs in a portion of the SiGe layer 42. In particular, ion implantation of a dose of $1 \times 10^{13}/cm^2$ is performed with an acceleration energy of 30 keV at a tilt angle of 45 degrees.

Figure 10D:
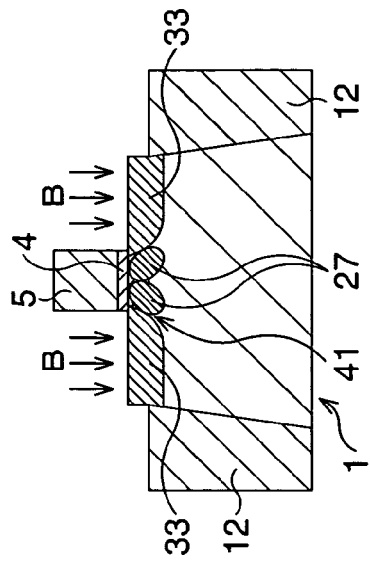

Then, the gate electrode 5 is used as a mask to implant a dose of $1 \times 10^{14}/cm^2$ of ions of a p-type impurity, boron B herein, into the surface of the semiconductor film 41 and Si substrate 1 with an acceleration energy of 1 keV at a tilt angle of 0 degrees to form a pair of extension regions 33 as shown in FIG. 10D.

Figure 10E:
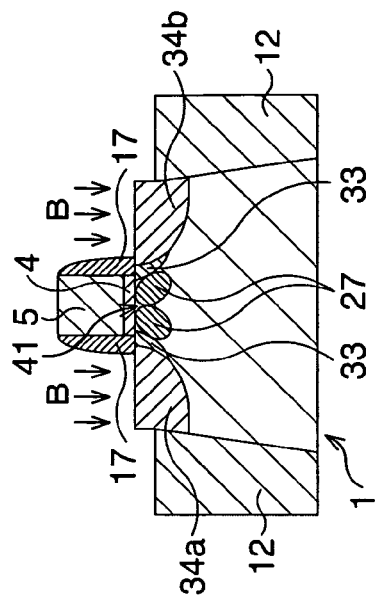

Then, an insulator film, a silicon oxide film herein, is deposited on the entire surface to cover the gate electrode 5 and anisotropic etching (etching back) is applied to the entire surface of the silicon oxide film so that the silicon oxide film is left only both side-surfaces of the gate electrode 5, thus forming sidewall insulator films 17 as shown in FIG. 10E. Then, the gate electrode 5 and the sidewall insulator films 17 are used as a mask to implant a dose $1 \times 10^{15}/cm^2$ of ions of a p-type impurity, boron B herein, into the surface of the semiconductor film 41 and Si substrate 1 with an acceleration energy of 5 keV at a tilt angle of 0 degrees to form a pair of a source region 34a and a drain region 34b that overlap a portion of the extension regions 33 and are deeper than the extension regions 33.

Then, activation annealing is performed at temperature of 1,000° C. for one second to thermally diffuse the implanted impurities. During the activation annealing, the ions of arsenic implanted to form the pocket regions 27 exhibit a higher diffusion coefficient in the SiGe layer 42 and a lower diffusion coefficient in the Si layer 43. This facilitates lateral diffusion from the pocket regions 27 in the SiGe layer 42 and therefore large amount of the arsenic diffuses into the SiGe layer 42, whereas the amount of arsenic diffused from the pocket regions 27 to the Si layer 43 is small. As a result, the arsenic is distributed in the SiGe layer 42 with a higher concentration and distributed in the Si layer 43 with a lower concentration than the SiGe layer 42. Accordingly, the electric field in the Si layer 43 is reduced and the SiGe layer 42 and the Si layer 43 are prevented from becoming parallel channels. Instead, only the SiGe layer 42 functions as a positive hole channel with a higher mobility. It is to be expected that a higher improvement in characteristics will be provided especially in short-channel p-type MOS transistors in which ion implantation for forming pocket regions determines their channel impurity profiles.

Figure 10F:
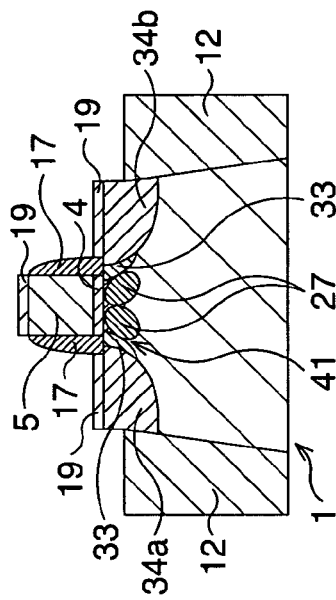

Then, a metal silicide, a Ni film herein, is formed on the entire surface and thermal treatment is applied to it to form a silicide (NiSi) film 19 on the gate electrode 5 and on the Si layer 43 in the source/drain region 34a and 34b (salicidation) as shown in FIG. 10F. Then, an unreacted Ni film is removed, and inter-layer films, contact holes, and a wiring layer are formed to complete the p-type MOS transistor.

As has been described, according to the eighth embodiment, the n-type impurity ion implantation for suppressing the short-channel effect in an p-type MOS transistor including a heterojunction semiconductor film having a compression-strain structure can be used to make the concentration of the n-type impurity in the SiGe layer 42 higher than that in the Si layer 43. As a result, only the SiGe layer 42 functions as a channel, thereby increasing the mobility of holes. Thus, a highly reliable p-type MOS transistor with improved transistor characteristics can be implemented easily and reliably.

Ninth Embodiment

In a ninth embodiment, ion implantation of an p-type impurity for forming a source/drain region is used as a control method for providing a higher concentration distribution of an n-type impurity in a SiGe layer and a lower concentration distribution of the n-type impurity in a Si layer in a semiconductor film that forms a channel in a p-type MOS transistor. The p-type impurity cancels out distribution of an n-type impurity, for example arsenic (As), in the Si layer, thus the concentration of arsenic in the SiGe layer becomes higher than in the Si layer.

FIGS. 11A to 11F are schematic cross-sectional diagrams showing stepwise a method for manufacturing a p-type MOS transistor according to the ninth embodiment. In the ninth embodiment, a structure of the p-type MOS transistor will be described along with the manufacturing method.

Figure 11A:
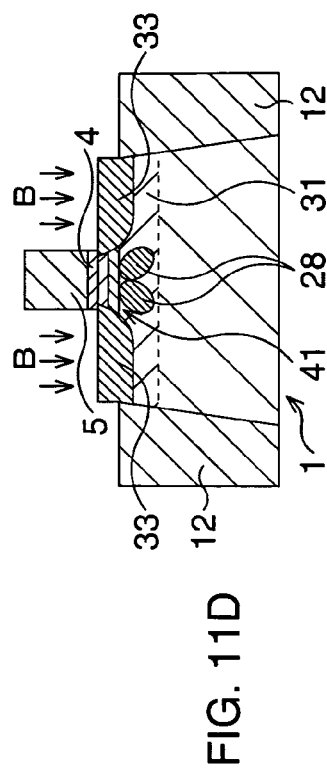
FIGS. 11A to 11F are schematic cross-sectional diagrams showing stepwise a method for manufacturing an n-type MOS transistor according to a ninth embodiment.

First, a device isolation structure, which herein is an STI structure 12 in which a trench formed in a device isolation region of a silicon semiconductor substrate (Si substrate) 1 is filled with an insulator such as a silicon oxide film, is formed in the device isolation region to define an active region 31 as shown in FIG. 11A. Then, for the purpose of controlling the threshold voltage ($V_{th}$), a dose of $1 \times 10^{13}/cm^2$ of ions of an n-type impurity, which is arsenic herein, is implanted with an acceleration energy of 100 keV into the surface of the active region 31 into form a channel impurity region 32.

Figure 11B:
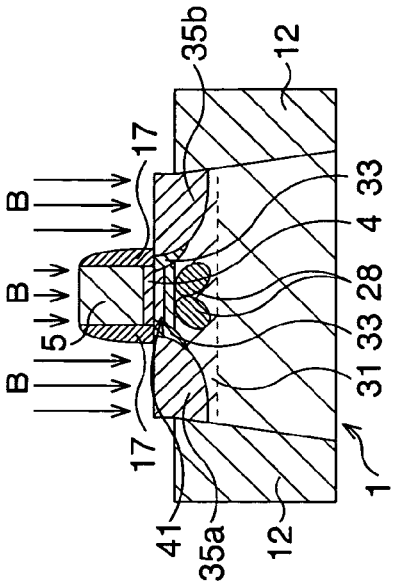

Then, a CVD method is used to selectively deposit a thin SiGe layer 42 and Si layer 43 on the active region 31 to form a two-layered semiconductor film 41 as shown in FIG. 11B. Here, in order to provide the impurity distribution of arsenic described earlier, the SiGe layer 42 is formed thicker than the Si layer 43. For example, the SiGe layer 42 is formed to a thickness of approximately 4 nm whereas the Si layer 43 is formed to a thickness of approximately 3 nm.

Figure 11C:
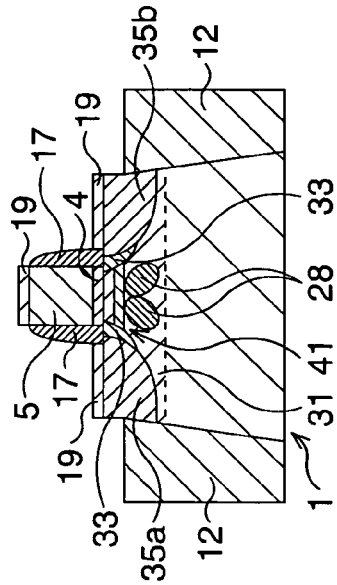

Then, a silicon oxide film, which forms a gate insulating film 4, is formed on the Si layer 43 to a thickness of approximately 1.5 nm as shown in FIG. 11C. A polycrystalline silicon film is then deposited on the gate insulating film 4 and patterned to form a gate electrode 5. In order to adjust the impurity profile around the channel to suppress a short-channel effect, the gate electrode 5 is used as a mask to implant a dose of $1 \times 10^{13}/cm^2$ of ions of an n-type impurity, arsenic herein, into the surface of the semiconductor film 41 and Si substrate 1 with an acceleration energy of 30 keV at a tilt angle of 45 degrees to form a pair of pocket regions 28.

Figure 11D:
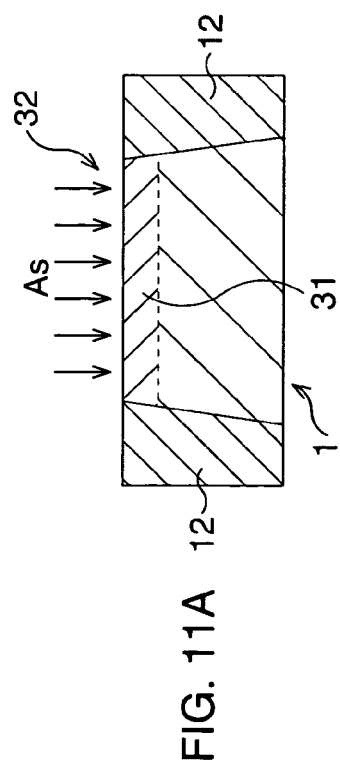
Figure 11E:
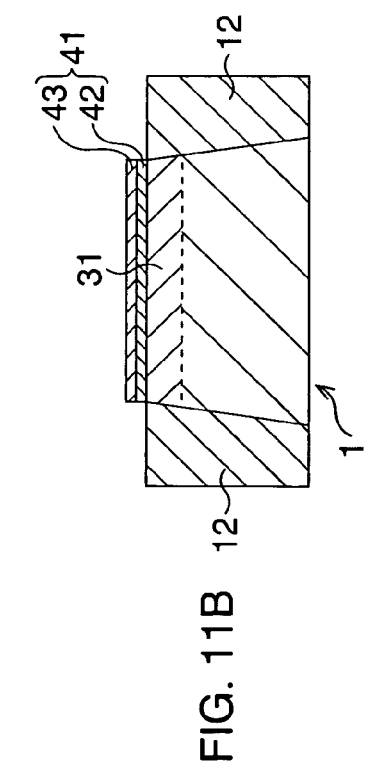

Then, the gate electrode 5 is used as a mask to implant a dose of $1 \times 10^{14}/cm^2$ of ions of p-type impurity, boron B herein, into the surface of the semiconductor film 41 and Si substrate 1 with an acceleration energy of 1 keV at a tilt angle of 0 degrees to form a pair of extension regions 33 as shown in FIG. 11D.

Then, an insulating film, a silicon oxide film herein, is deposited on the entire surface to cover the gate electrode 5 and anisotropic etching (etching back) is applied to the entire surface of the silicon oxide film so that the silicon oxide film is left only on both sides of the gate electrode 5, thus forming a sidewall insulator film 17.

Then the gate electrode 5 and the sidewall insulator films 17 are used as a mask to implant ions of a p-type impurity, boron B herein, into the surface of the semiconductor film 41 and Si substrate 1 to form a pair of source region 35a and drain region 35b that overlap a portion of the extension regions 33 and are deeper than the extension region 33. In this case, the acceleration energy is controlled so that the implanted boron penetrates through the gate electrode 5 and the gate insulating film 4 to reach the underlying Si layer 43. In particular, a dose of $1 \times 10^{15}/cm^2$ of impurity ions is implanted with an acceleration energy of 8 keV at a tilt angle of 0 degrees.

Then, activation annealing is performed at 1,000° C. for one second to thermally diffuse the introduced impurities. During the annealing, the p-type impurity, boron, implanted to form the source/drain region 35a, 35b diffuses in the Si layer 43, the distribution of the n-type impurity, arsenic, in the Si layer 43 is cancelled out by the boron, and therefore the concentration of the n-type impurity substantially decreases. As a result, the concentration of the arsenic in the SiGe layer 42 is higher than in the Si layer 43 and therefore the arsenic is distributed sparsely in the Si layer 43 with respect to the SiGe layer 42. Accordingly, the electric field in the Si layer 43 becomes smaller, the SiGe layer 42 and the Si layer 43 are prevented from becoming parallel channels, and only the SiGe layer 42 functions as a positive hole channel with a high mobility.

Figure 11F:
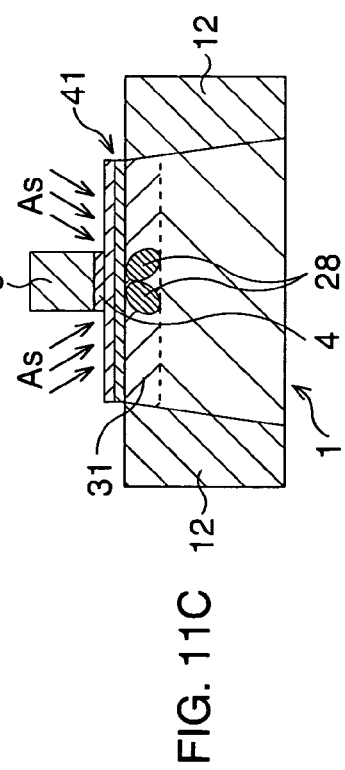
Figure 12:
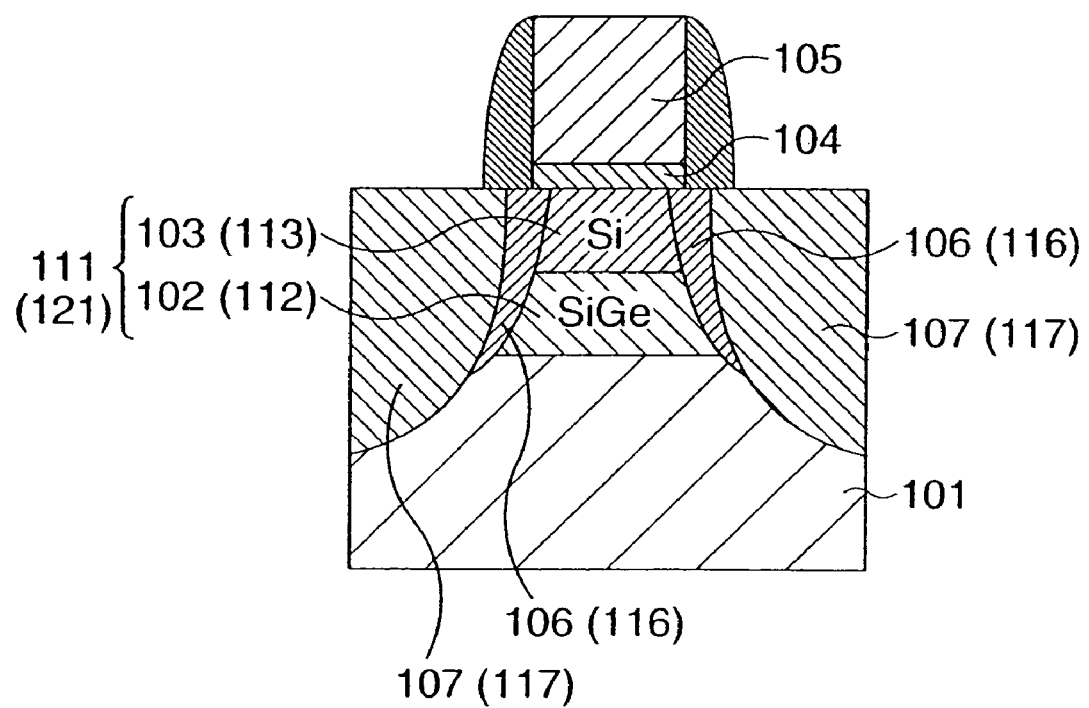
FIG. 12 is a schematic cross-sectional diagram showing a semiconductor device including a heterojunction-structure semiconductor film having a conventional compression strain structure.
Figure 13B:
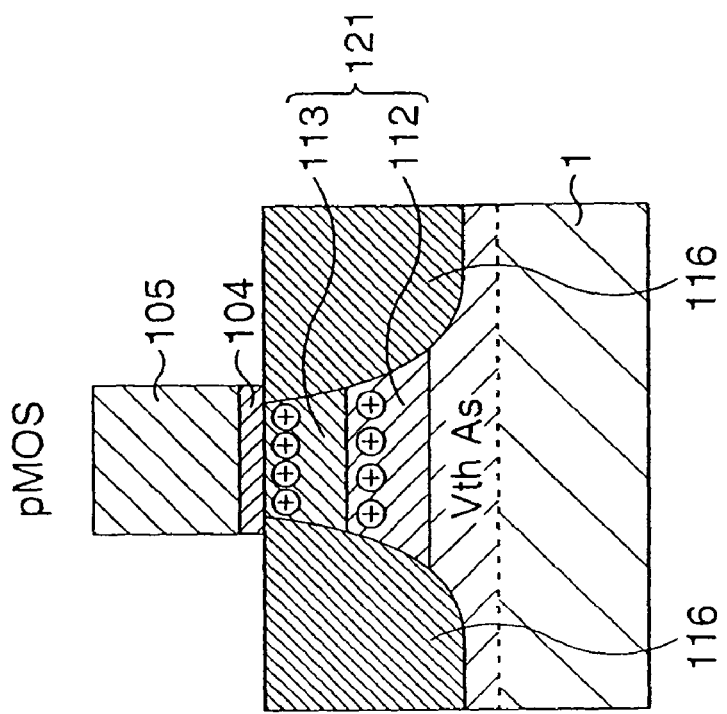
FIGS. 13A and 13B are schematic cross-sectional diagrams for explaining problems with semiconductor devices including a heterojunction-structure semiconductor film having a conventional compression strain structure.
Figure 13A:
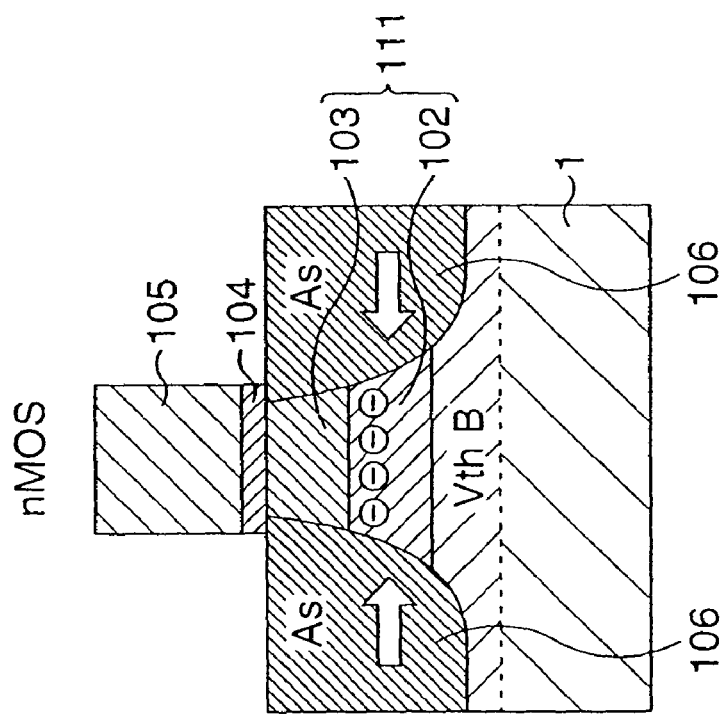

Then, a metal silicide, a Ni film herein, is formed on the entire surface and thermal treatment is applied to it to form a silicide (NiSi) film 19 on the gate electrode 5 and on the Si layer 43 in the source/drain region 35a and 35b (salicidation) as shown in FIG. 11F. Then, an unreacted Ni film is removed, and inter-layer films, contact holes, and a wiring layer are formed to complete the p-type MOS transistor.

As has been described, according to the ninth embodiment, the n-type impurity ion implantation for forming the source/drain regions 35a, 35b in a p-type MOS transistor including a heterojunction semiconductor film having a compression strain structure can be used to make the concentration of the n-type impurity in the SiGe layer 42 higher than that in the Si layer 43. As a result, only the SiGe layer 42 functions as a channel, thereby increasing the mobility of holes. Thus, a highly reliable p-type MOS transistor with improved transistor characteristics can be implemented easily and reliably.

It should be noted that, throughout the embodiments described above, ion implantation conditions and anneal conditions for achieving a desired Vth of transistors can be chosen as appropriate.

INDUSTRIAL APPLICABILITY

According to the present invention, there can be provided a highly reliable semiconductor device including a heterojunction semiconductor film having a compression strain structure by increasing the mobility to improve the transistor characteristics.

What is claimed is:
1. A semiconductor device comprising:
   a semiconductor substrate;

a semiconductor film formed on the semiconductor substrate;

a gate formed on an insulator film on the semiconductor film;

a pair of first impurity diffusion regions formed by doping the semiconductor film on both side of the gate with a first impurity; and a pair of second impurity diffusion regions which is formed apart from the pair of first impurity diffusion regions and formed by doping both side of the gate with a second impurity which is of the conductivity type opposite to that of the first impurity, wherein the semiconductor film has a heterojunction structure formed by two layers of semiconductors of different types in which a third impurity having the same conductivity type as that of the second impurity exhibits different diffusion coefficients, and the third impurity is distributed with a higher concentration in one of the semiconductor layers than in the other of the semiconductor layers, wherein an impurity surface layer region is formed by doping a surface layer of the semiconductor substrate with the second impurity, and the second impurity diffusion region is formed in the impurity surface layer region, the impurity surface layer region is formed below the semiconductor film, and an upper surface of the impurity surface layer region is in contact with a lower surface of the semiconductor film, and in the pair of the second impurity diffusion regions, a first side and a second side of the second impurity diffusion regions are formed of a same impurity, the first side of the second impurity diffusion region is deeper than the second side of the second impurity diffusion region.

2. The semiconductor device according to claim 1, wherein the second impurity is distributed with a higher concentration in the lower one of the two semiconductor layers of the two types than in the upper one of the semiconductor layers.

3. The semiconductor device according to claim 2, wherein the lower semiconductor layer is thicker than the upper semiconductor layer.

4. The semiconductor device according to claim 2, wherein the semiconductor device is an n-type MIS transistor in which the first impurity is an n-type impurity; and the semiconductor film consists of a lower semiconductor layer of Si and an upper semiconductor layer of a material in which the second impurity exhibits a diffusion coefficient smaller than in Si.

5. A semiconductor device comprising:

a semiconductor substrate;

a semiconductor film formed on the semiconductor substrate;

a gate formed on an insulator film on the semiconductor film;

a pair of first impurity diffusion regions formed by doping the semiconductor film on both side of the gate with a first impurity, and a pair of second impurity diffusion regions which is formed apart from the pair of first impurity diffusion regions and formed by doping both side of the gate with a second impurity which is of the conductivity type opposite to that of the first impurity, wherein an impurity surface layer region is formed by doping a surface layer of the semiconductor substrate with the second impurity, wherein the semiconductor film has a heterojunction structure formed by a SiGe layer and a Si layer in which the second impurity exhibits different diffusion coefficients, and the second impurity is distributed with a higher concentration in the SiGe layer than in the Si layer, the impurity surface layer region is formed below the semiconductor film, and an upper surface of the impurity surface layer region is in contact with a lower surface of the semiconductor film, and in the pair of the second impurity diffusion regions, a first side and a second side of the second impurity diffusion regions are formed of a same impurity, the first side of the second impurity diffusion regions is deeper than the second side of the second impurity diffusion regions.

6. The semiconductor device according to claim 5, wherein the Si layer becomes a channel layer when the semiconductor device is an n-type MOS transistor whereas the SiGe layer becomes a channel layer when the semiconductor device is a p-type MOS transistor.

7. The semiconductor device according to claim 5, wherein the pair of second impurity diffusion regions consist of two separate regions.

* * * * *